(12) United States Patent
Lloyd et al.

(10) Patent No.: US 11,688,960 B2
(45) Date of Patent: *Jun. 27, 2023

(54) ROUTING ASSEMBLY AND SYSTEM USING SAME

(71) Applicant: Molex, LLC, Lisle, IL (US)

(72) Inventors: Brian Keith Lloyd, Maumelle, AR (US); Gregory Fitzgerald, Merrimack, NH (US); Bruce Reed, Maumelle, AR (US); Gregory B. Walz, Maumelle, AR (US); Ayman Isaac, Little Rock, AR (US)

(73) Assignee: Molex, LLC, Lisle, IL (US)

( * ) Notice: Subject to any disclaimer, the term of this patent is extended or adjusted under 35 U.S.C. 154(b) by 4 days.

This patent is subject to a terminal disclaimer.

(21) Appl. No.: 17/391,072

(22) Filed: Aug. 2, 2021

(65) Prior Publication Data
US 2021/0359438 A1 Nov. 18, 2021

Related U.S. Application Data

(63) Continuation of application No. 17/012,079, filed on Sep. 4, 2020, now Pat. No. 11,108,176, which is a
(Continued)

(51) Int. Cl.
*H01R 12/70* (2011.01)
*H01R 12/73* (2011.01)
(Continued)

(52) U.S. Cl.
CPC ......... *H01R 12/7076* (2013.01); *G06F 13/38* (2013.01); *H01R 12/73* (2013.01);
(Continued)

(58) Field of Classification Search
CPC .. H01R 12/79; H01R 12/592; H01R 12/7076; H01R 12/73; H01R 31/06; H01R 31/02;
(Continued)

(56) References Cited

U.S. PATENT DOCUMENTS 3,002,583 A 10/1961 Findlay
3,007,131 A 10/1961 Dahlgren et al.
(Continued)

FOREIGN PATENT DOCUMENTS

CN 2379933 Y 5/2000
CN 1266813 A 9/2000
(Continued)

OTHER PUBLICATIONS

"File:Wrt54gl-layout.jpg-Embedded Xinu", Internet Citation, Sep. 8, 2006, Retrieved from the Internet, Sep. 23, 2014.
(Continued)

*Primary Examiner* — Gary F Paumen

(57) ABSTRACT

A routing assembly for an electronic device has a front face with an array of connectors ports and each of the connector ports contain a first connector mounted therein. A first end of a cable can be directly terminated to the first connectors and the cables can be embedded in a tray that is configured to extend toward a chip package. The cables extend from the tray and terminates to a second connector that can be electrically connected to the chip package so as to provide a communication path between the first connector and the second connector that substantially bypasses a supporting circuit board.

17 Claims, 15 Drawing Sheets

Related U.S. Application Data continuation of application No. 16/454,080, filed on Jun. 27, 2019, now Pat. No. 10,797,416, which is a continuation of application No. 15/561,852, filed as application No. PCT/US2017/012917 on Jan. 11, 2017, now Pat. No. 10,424,856.

(60) Provisional application No. 62/277,275, filed on Jan. 11, 2016.

(51) Int. Cl.
    *H01R 12/79*     (2011.01)
    *H01R 13/518*    (2006.01)
    *G06F 13/38*     (2006.01)

(52) U.S. Cl.
    CPC .......... *H01R 12/79* (2013.01); *H01R 13/518* (2013.01); *H01L 2924/15192* (2013.01)

(58) Field of Classification Search
    CPC .................. H01R 13/518; G06F 13/38; H01L 2924/15192
    USPC .... 439/492, 494, 502; 333/33, 34, 260, 238, 333/246
    See application file for complete search history.

(56) References Cited

U.S. PATENT DOCUMENTS

| | | |
|---|---|---|
| 3,594,613 A | 7/1971 | Prietula |
| 3,633,152 A | 1/1972 | Podmore |
| 3,963,319 A | 6/1976 | Schumacher et al. |
| 4,009,921 A | 3/1977 | Narozny |
| 4,025,141 A | 5/1977 | Thelissen |
| 4,060,295 A | 11/1977 | Tomkiewicz |
| 4,072,387 A | 2/1978 | Sochor |
| 4,083,615 A | 4/1978 | Volinskie |
| 4,157,612 A | 6/1979 | Rainal |
| 4,290,664 A | 9/1981 | Davis et al. |
| 4,307,926 A | 12/1981 | Smith |
| 4,346,355 A | 8/1982 | Tsukii |
| 4,417,779 A | 11/1983 | Wilson |
| 4,508,403 A | 4/1985 | Weltman et al. |
| 4,611,186 A | 9/1986 | Ziegner |
| 4,615,578 A | 10/1986 | Stadler et al. |
| 4,639,054 A | 1/1987 | Kersbergen |
| 4,656,441 A | 4/1987 | Takahashi et al. |
| 4,657,329 A | 4/1987 | Dechelette |
| 4,679,321 A | 7/1987 | Plonski |
| 4,697,862 A | 10/1987 | Hasircoglu |
| 4,724,409 A | 2/1988 | Lehman |
| 4,889,500 A | 12/1989 | Lazar et al. |
| 4,924,179 A | 5/1990 | Sherman |
| 4,948,379 A | 8/1990 | Evans |
| 4,984,992 A | 1/1991 | Beamenderfer et al. |
| 4,991,001 A | 2/1991 | Takubo et al. |
| 5,112,251 A | 5/1992 | Cesar |
| 5,197,893 A | 3/1993 | Morlion et al. |
| 5,332,979 A | 7/1994 | Roskewitsch et al. |
| 5,387,130 A | 2/1995 | Fedder et al. |
| 5,402,088 A | 3/1995 | Pierro et al. |
| 5,435,757 A | 7/1995 | Fedder et al. |
| 5,441,424 A | 8/1995 | Morlion et al. |
| 5,479,110 A | 12/1995 | Crane et al. |
| 5,487,673 A | 1/1996 | Hurtarte |
| 5,509,827 A | 4/1996 | Huppenthal et al. |
| 5,554,038 A | 9/1996 | Morlion et al. |
| 5,598,627 A | 2/1997 | Saka et al. |
| 5,632,634 A | 5/1997 | Soes |
| 5,691,506 A | 11/1997 | Miyazaki et al. |
| 5,781,759 A | 7/1998 | Kashiwabara |
| 5,784,644 A | 7/1998 | Larabell |
| 5,813,243 A | 9/1998 | Johnson et al. |
| 5,842,873 A | 12/1998 | Gonzales |
| 5,876,239 A | 3/1999 | Morin et al. |
| 6,004,139 A | 12/1999 | Dramstad et al. |
| 6,053,770 A | 4/2000 | Blom |
| 6,067,226 A | 5/2000 | Barker et al. |
| 6,083,046 A | 7/2000 | Wu et al. |
| 6,095,872 A | 8/2000 | Lang et al. |
| 6,098,127 A | 8/2000 | Kwang |
| 6,139,372 A | 10/2000 | Yang |
| 6,144,559 A | 11/2000 | Johnson et al. |
| 6,156,981 A | 12/2000 | Ward et al. |
| 6,195,263 B1 | 2/2001 | Aoike |
| 6,203,376 B1 | 3/2001 | Magajne et al. |
| 6,216,184 B1 | 4/2001 | Fackenthall et al. |
| 6,238,219 B1 | 5/2001 | Wu |
| 6,255,741 B1 | 7/2001 | Yoshihara et al. |
| 6,266,712 B1 | 7/2001 | Henrichs |
| 6,273,753 B1 | 8/2001 | Ko |
| 6,273,758 B1 | 8/2001 | Lloyd et al. |
| 6,366,471 B1 | 4/2002 | Edwards et al. |
| 6,368,120 B1 | 4/2002 | Scherer et al. |
| 6,371,788 B1 | 4/2002 | Bowling et al. |
| 6,452,789 B1 | 9/2002 | Pallotti et al. |
| 6,454,605 B1 | 9/2002 | Bassler et al. |
| 6,489,563 B1 | 12/2002 | Zhao et al. |
| 6,535,367 B1 | 3/2003 | Carpenter et al. |
| 6,538,903 B1 | 3/2003 | Radu et al. |
| 6,574,115 B2 | 6/2003 | Asano et al. |
| 6,575,772 B1 | 6/2003 | Soubh et al. |
| 6,592,401 B1 | 7/2003 | Gardner et al. |
| 6,652,296 B2 | 11/2003 | Kuroda et al. |
| 6,652,318 B1 | 11/2003 | Winings et al. |
| 6,667,891 B2 | 12/2003 | Coglitore et al. |
| 6,685,501 B1 | 2/2004 | Wu et al. |
| 6,692,262 B1 | 2/2004 | Loveless |
| 6,705,893 B1 | 3/2004 | Ko |
| 6,764,342 B2 | 7/2004 | Murayama et al. |
| 6,780,069 B2 | 8/2004 | Scherer et al. |
| 6,797,891 B1 | 9/2004 | Blair et al. |
| 6,812,560 B2 | 11/2004 | Recktenwald et al. |
| 6,824,426 B1 | 11/2004 | Spink, Jr. |
| 6,843,657 B2 | 1/2005 | Driscoll et al. |
| 6,859,854 B2 | 2/2005 | Kwong |
| 6,863,549 B2 | 3/2005 | Brunker et al. |
| 6,878,012 B2 | 4/2005 | Gutierrez et al. |
| 6,882,241 B2 | 4/2005 | Abo et al. |
| 6,903,934 B2 | 6/2005 | Lo et al. |
| 6,910,914 B1 | 6/2005 | Spink, Jr. |
| 6,916,183 B2 | 7/2005 | Alger et al. |
| 6,955,565 B2 | 10/2005 | Lloyd et al. |
| 6,969,270 B2 | 11/2005 | Renfro et al. |
| 6,969,280 B2 | 11/2005 | Chien et al. |
| 6,971,887 B1 | 12/2005 | Trobough |
| 7,004,765 B2 | 2/2006 | Hsu et al. |
| 7,004,767 B2 | 2/2006 | Kim |
| 7,004,793 B2 | 2/2006 | Scherer et al. |
| 7,008,234 B1 | 3/2006 | Brown |
| 7,040,918 B2 | 5/2006 | Moriyama et al. |
| 7,044,772 B2 | 5/2006 | Mccreery et al. |
| 7,052,292 B2 | 5/2006 | Hsu et al. |
| 7,056,128 B2 | 6/2006 | Driscoll et al. |
| 7,066,756 B2 | 6/2006 | Lange et al. |
| 7,070,446 B2 | 7/2006 | Henry et al. |
| 7,086,888 B2 | 8/2006 | Wu |
| 7,108,522 B2 | 9/2006 | Verelst et al. |
| 7,148,428 B2 | 12/2006 | Meier et al. |
| 7,163,421 B1 | 1/2007 | Cohen et al. |
| 7,168,961 B2 | 1/2007 | Hsieh |
| 7,175,446 B2 | 2/2007 | Bright et al. |
| 7,192,300 B2 | 3/2007 | Hashiguchi et al. |
| 7,214,097 B1 | 5/2007 | Hsu et al. |
| 7,223,915 B2 | 5/2007 | Hackman |
| 7,234,944 B2 | 6/2007 | Nordin et al. |
| 7,244,137 B2 | 7/2007 | Renfro et al. |
| 7,280,372 B2 | 10/2007 | Grundy et al. |
| 7,307,293 B2 | 12/2007 | Fjelstad et al. |
| 7,331,816 B2 | 2/2008 | Krohn et al. |
| 7,345,359 B2 | 3/2008 | Kim et al. |
| 7,384,275 B2 | 6/2008 | Ngo |
| 7,394,665 B2 | 7/2008 | Hamasaki et al. |
| 7,402,048 B2 | 7/2008 | Meier et al. |

(56) References Cited

U.S. PATENT DOCUMENTS

| | | |
|---|---|---|
| 7,431,608 B2 | 10/2008 | Sakaguchi et al. |
| 7,445,471 B1 | 11/2008 | Scherer et al. |
| 7,462,924 B2 | 12/2008 | Shuey |
| 7,489,514 B2 | 2/2009 | Hamasaki et al. |
| 7,534,142 B2 | 5/2009 | Avery et al. |
| 7,535,090 B2 | 5/2009 | Furuyama et al. |
| 7,540,773 B2 | 6/2009 | Ko |
| 7,549,897 B2 | 6/2009 | Fedder et al. |
| 7,621,779 B2 | 11/2009 | Laurx et al. |
| 7,637,767 B2 | 12/2009 | Davis et al. |
| 7,654,831 B1 | 2/2010 | Wu |
| 7,658,654 B2 | 2/2010 | Ohyama et al. |
| 7,667,982 B2 | 2/2010 | Hamasaki et al. |
| 7,690,930 B2 | 4/2010 | Chen et al. |
| 7,719,843 B2 | 5/2010 | Dunham |
| 7,737,360 B2 | 6/2010 | Wiemeyer et al. |
| 7,744,385 B2 | 6/2010 | Scherer |
| 7,744,403 B2 | 6/2010 | Barr et al. |
| 7,744,414 B2 | 6/2010 | Scherer et al. |
| 7,748,988 B2 | 7/2010 | Hori et al. |
| 7,771,207 B2 | 8/2010 | Hamner et al. |
| 7,789,529 B2 | 9/2010 | Roberts et al. |
| 7,813,146 B1 | 10/2010 | Phan |
| 7,819,675 B2 | 10/2010 | Ko et al. |
| 7,824,197 B1 | 11/2010 | Westman |
| 7,857,629 B2 | 12/2010 | Chin |
| 7,857,630 B2 | 12/2010 | Hermant et al. |
| 7,862,344 B2 | 1/2011 | Morgan et al. |
| 7,892,019 B2 | 2/2011 | Rao et al. |
| 7,904,763 B2 | 3/2011 | Araki et al. |
| 7,906,730 B2 | 3/2011 | Atkinson et al. |
| 7,931,502 B2 | 4/2011 | Iida et al. |
| 7,985,097 B2 | 7/2011 | Gulla |
| 7,997,933 B2 | 8/2011 | Feldman et al. |
| 8,002,583 B2 | 8/2011 | Van Woensel |
| 8,018,733 B2 | 9/2011 | Jia |
| 8,035,973 B2 | 10/2011 | Mccolloch |
| 8,036,500 B2 | 10/2011 | Mccolloch |
| 8,089,779 B2 | 1/2012 | Fietz et al. |
| 8,096,813 B2 | 1/2012 | Biggs |
| 8,157,573 B2 | 4/2012 | Tanaka |
| 8,162,675 B2 | 4/2012 | Regnier et al. |
| 8,187,038 B2 | 5/2012 | Kamiya et al. |
| 8,188,594 B2 | 5/2012 | Ganesan et al. |
| 8,192,222 B2 | 6/2012 | Kameyama |
| 8,226,441 B2 | 7/2012 | Regnier et al. |
| 8,308,491 B2 | 11/2012 | Nichols et al. |
| 8,337,243 B2 | 12/2012 | Elkhatib et al. |
| 8,338,713 B2 | 12/2012 | Fjelstad et al. |
| 8,374,470 B2 | 2/2013 | Ban et al. |
| 8,398,433 B1 | 3/2013 | Yang |
| 8,419,472 B1 | 4/2013 | Swanger et al. |
| 8,435,074 B1 | 5/2013 | Grant et al. |
| 8,439,704 B2 | 5/2013 | Reed |
| 8,449,312 B2 | 5/2013 | Lang et al. |
| 8,449,330 B1 | 5/2013 | Schroll et al. |
| 8,465,302 B2 | 6/2013 | Regnier et al. |
| 8,480,413 B2 | 7/2013 | Minich et al. |
| 8,517,765 B2 | 8/2013 | Schroll et al. |
| 8,535,069 B2 | 9/2013 | Zhang |
| 8,540,525 B2 | 9/2013 | Regnier et al. |
| 8,553,102 B2 | 10/2013 | Yamada |
| 8,575,491 B2 | 11/2013 | Gundel et al. |
| 8,575,529 B2 | 11/2013 | Asahi et al. |
| 8,585,442 B2 | 11/2013 | Tuma et al. |
| 8,588,561 B2 | 11/2013 | Zbinden et al. |
| 8,597,055 B2 | 12/2013 | Regnier et al. |
| 8,651,890 B2 | 2/2014 | Chiarelli |
| 8,672,707 B2 | 3/2014 | Nichols et al. |
| 8,687,350 B2 | 4/2014 | Santos |
| 8,690,604 B2 | 4/2014 | Davis |
| 8,715,003 B2 | 5/2014 | Buck et al. |
| 8,721,361 B2 | 5/2014 | Wu |
| 8,740,644 B2 | 6/2014 | Long |
| 8,747,158 B2 | 6/2014 | Szczesny et al. |
| 8,753,145 B2 | 6/2014 | Lang et al. |
| 8,758,051 B2 | 6/2014 | Nonen et al. |
| 8,764,483 B2 | 7/2014 | Ellison |
| 8,784,122 B2 | 7/2014 | Soubh et al. |
| 8,787,711 B2 | 7/2014 | Zbinden et al. |
| 8,794,991 B2 | 8/2014 | Ngo |
| 8,804,342 B2 | 8/2014 | Behziz et al. |
| 8,814,595 B2 | 8/2014 | Cohen et al. |
| 8,834,190 B2 | 9/2014 | Ngo et al. |
| 8,845,364 B2 | 9/2014 | Wanha et al. |
| 8,864,521 B2 | 10/2014 | Atkinson et al. |
| 8,888,533 B2 | 11/2014 | Westman et al. |
| 8,905,767 B2 | 12/2014 | Putt, Jr. et al. |
| 8,911,255 B2 | 12/2014 | Scherer et al. |
| 8,926,342 B2 | 1/2015 | Vinther et al. |
| 8,926,377 B2 | 1/2015 | Kirk et al. |
| 8,992,236 B2 | 3/2015 | Wittig et al. |
| 8,992,237 B2 | 3/2015 | Regnier et al. |
| 8,992,258 B2 | 3/2015 | Raschilla et al. |
| 9,011,177 B2 | 4/2015 | Lloyd et al. |
| 9,028,281 B2 | 5/2015 | Kirk et al. |
| 9,035,183 B2 | 5/2015 | Kodama et al. |
| 9,040,824 B2 | 5/2015 | Guetig et al. |
| 9,054,432 B2 | 6/2015 | Yang |
| 9,071,001 B2 | 6/2015 | Scherer et al. |
| 9,093,792 B2 | 7/2015 | Shiratori et al. |
| 9,118,151 B2 | 8/2015 | Tran et al. |
| 9,119,292 B2 | 8/2015 | Gundel |
| 9,136,652 B2 | 9/2015 | Ngo |
| 9,142,921 B2 | 9/2015 | Wanha et al. |
| 9,155,214 B2 | 10/2015 | Ritter et al. |
| 9,160,123 B1 | 10/2015 | Pao et al. |
| 9,160,151 B2 | 10/2015 | Vinther et al. |
| 9,161,463 B2 | 10/2015 | Takamura et al. |
| 9,166,320 B1 | 10/2015 | Herring et al. |
| 9,196,983 B2 | 11/2015 | Saur et al. |
| 9,203,171 B2 | 12/2015 | Yu et al. |
| 9,209,539 B2 | 12/2015 | Herring |
| 9,214,756 B2 | 12/2015 | Nishio et al. |
| 9,214,768 B2 | 12/2015 | Pao et al. |
| 9,232,676 B2 | 1/2016 | Sechrist et al. |
| 9,246,251 B2 | 1/2016 | Regnier et al. |
| 9,277,649 B2 | 3/2016 | Ellison |
| 9,292,055 B2 | 3/2016 | Wu |
| 9,312,618 B2 | 4/2016 | Regnier et al. |
| 9,331,432 B1 | 5/2016 | Phillips |
| 9,350,108 B2 | 5/2016 | Long |
| 9,356,366 B2 | 5/2016 | Moore |
| 9,385,455 B2 | 7/2016 | Regnier et al. |
| 9,391,407 B1 | 7/2016 | Bucher et al. |
| 9,401,563 B2 | 7/2016 | Simpson et al. |
| 9,413,090 B2 | 8/2016 | Nagamine |
| 9,413,097 B2 | 8/2016 | Tamarkin et al. |
| 9,413,112 B2 | 8/2016 | Helster et al. |
| 9,431,773 B2 | 8/2016 | Chen et al. |
| 9,437,981 B2 | 9/2016 | Wu et al. |
| 9,455,538 B2 | 9/2016 | Nishio et al. |
| 9,484,671 B2 | 11/2016 | Zhu et al. |
| 9,484,673 B1 | 11/2016 | Yang |
| 9,490,587 B1 | 11/2016 | Phillips et al. |
| 9,496,655 B1 | 11/2016 | Huang et al. |
| 9,515,429 B2 | 12/2016 | De Geest et al. |
| 9,525,245 B2 | 12/2016 | Regnier et al. |
| 9,543,688 B2 | 1/2017 | Pao et al. |
| 9,553,381 B2 | 1/2017 | Regnier |
| 9,559,465 B2 | 1/2017 | Phillips et al. |
| 9,565,780 B2 | 2/2017 | Nishio et al. |
| 9,608,388 B2 | 3/2017 | Kondo et al. |
| 9,608,590 B2 | 3/2017 | Hamner et al. |
| 9,627,818 B1 | 4/2017 | Chen et al. |
| 9,660,364 B2 | 5/2017 | Wig et al. |
| 9,666,998 B2 | 5/2017 | De Boer et al. |
| 9,673,570 B2 | 6/2017 | Briant et al. |
| 9,705,258 B2 | 7/2017 | Phillips et al. |
| 9,812,799 B2 | 11/2017 | Wittig |
| 9,846,287 B2 | 12/2017 | Mack |
| 9,985,367 B2 | 5/2018 | Wanha et al. |
| 10,348,015 B2 | 7/2019 | Mason et al. |
| 10,424,856 B2 * | 9/2019 | Lloyd .................. H01R 12/79 |

(56) References Cited

U.S. PATENT DOCUMENTS

| | | | |
|---|---|---|---|
| 10,637,200 B2 | 4/2020 | Lloyd et al. | |
| 10,797,416 B2 * | 10/2020 | Lloyd | H01R 13/518 |
| 11,108,176 B2 * | 8/2021 | Lloyd | G06F 13/38 |
| 2001/0016438 A1 | 8/2001 | Reed | |
| 2001/0042913 A1 | 11/2001 | Fukuda et al. | |
| 2002/0111067 A1 | 8/2002 | Sakurai et al. | |
| 2002/0157865 A1 | 10/2002 | Noda | |
| 2002/0180554 A1 | 12/2002 | Clark et al. | |
| 2003/0064616 A1 | 4/2003 | Reed et al. | |
| 2003/0073331 A1 | 4/2003 | Peloza et al. | |
| 2003/0180006 A1 | 9/2003 | Loh et al. | |
| 2003/0222282 A1 | 12/2003 | Fjelstad et al. | |
| 2004/0094328 A1 | 5/2004 | Fjelstad et al. | |
| 2004/0121633 A1 | 6/2004 | David et al. | |
| 2004/0155328 A1 | 8/2004 | Kline | |
| 2004/0155734 A1 | 8/2004 | Kosemura et al. | |
| 2004/0229510 A1 | 11/2004 | Lloyd et al. | |
| 2004/0264894 A1 | 12/2004 | Cooke et al. | |
| 2005/0006126 A1 | 1/2005 | Aisenbrey | |
| 2005/0051810 A1 | 3/2005 | Funakura et al. | |
| 2005/0093127 A1 | 5/2005 | Fjelstad et al. | |
| 2005/0130490 A1 | 6/2005 | Rose | |
| 2005/0142944 A1 | 6/2005 | Ling et al. | |
| 2005/0239339 A1 | 10/2005 | Pepe | |
| 2006/0001163 A1 | 1/2006 | Kolbehdari et al. | |
| 2006/0035523 A1 | 2/2006 | Kuroda et al. | |
| 2006/0038287 A1 | 2/2006 | Hamasaki et al. | |
| 2006/0050493 A1 | 3/2006 | Hamasaki et al. | |
| 2006/0067066 A1 | 3/2006 | Meier et al. | |
| 2006/0079102 A1 | 4/2006 | Delessert | |
| 2006/0079119 A1 | 4/2006 | Wu | |
| 2006/0088254 A1 | 4/2006 | Mohammed | |
| 2006/0091507 A1 | 5/2006 | Fjelstad et al. | |
| 2006/0114016 A1 | 6/2006 | Suzuki | |
| 2006/0160399 A1 | 7/2006 | Dawiedczyk et al. | |
| 2006/0189212 A1 | 8/2006 | Avery et al. | |
| 2006/0194475 A1 | 8/2006 | Miyazaki | |
| 2006/0216969 A1 | 9/2006 | Bright et al. | |
| 2006/0228922 A1 | 10/2006 | Morriss | |
| 2006/0234556 A1 | 10/2006 | Wu | |
| 2006/0238991 A1 | 10/2006 | Drake | |
| 2006/0282724 A1 | 12/2006 | Roulo | |
| 2006/0292898 A1 | 12/2006 | Meredith et al. | |
| 2007/0032104 A1 | 2/2007 | Yamada et al. | |
| 2007/0141871 A1 | 6/2007 | Scherer et al. | |
| 2007/0243741 A1 | 10/2007 | Yang | |
| 2008/0024999 A1 | 1/2008 | Huang | |
| 2008/0131997 A1 | 6/2008 | Kim et al. | |
| 2008/0171476 A1 | 7/2008 | Liu et al. | |
| 2008/0186666 A1 | 8/2008 | Wu | |
| 2008/0242127 A1 | 10/2008 | Murr et al. | |
| 2008/0297988 A1 | 12/2008 | Chau | |
| 2008/0305689 A1 | 12/2008 | Zhang et al. | |
| 2009/0023330 A1 | 1/2009 | Stoner et al. | |
| 2009/0153169 A1 | 6/2009 | Soubh et al. | |
| 2009/0166082 A1 | 7/2009 | Liu | |
| 2009/0174991 A1 | 7/2009 | Mahdavi | |
| 2009/0215309 A1 | 8/2009 | Mongold et al. | |
| 2010/0042770 A1 | 2/2010 | Chuang | |
| 2010/0068944 A1 | 3/2010 | Scherer | |
| 2010/0112850 A1 | 5/2010 | Rao et al. | |
| 2010/0120286 A1 | 5/2010 | Johnsen et al. | |
| 2010/0159829 A1 | 6/2010 | Mccormack | |
| 2010/0177489 A1 | 7/2010 | Yagisawa | |
| 2010/0190373 A1 | 7/2010 | Yeh | |
| 2010/0203768 A1 | 8/2010 | Kondo et al. | |
| 2011/0043371 A1 | 2/2011 | German et al. | |
| 2011/0074213 A1 | 3/2011 | Schaffer et al. | |
| 2011/0080719 A1 | 4/2011 | Jia | |
| 2011/0136387 A1 | 6/2011 | Matsuura et al. | |
| 2011/0177699 A1 | 7/2011 | Crofoot et al. | |
| 2011/0212633 A1 | 9/2011 | Regnier et al. | |
| 2011/0230104 A1 | 9/2011 | Lang et al. | |
| 2011/0263156 A1 | 10/2011 | Ko | |
| 2011/0300757 A1 | 12/2011 | Regnier et al. | |
| 2011/0304966 A1 | 12/2011 | Schrempp | |
| 2012/0003848 A1 | 1/2012 | Casher et al. | |
| 2012/0033370 A1 | 2/2012 | Reinke et al. | |
| 2012/0034820 A1 | 2/2012 | Lang et al. | |
| 2012/0225585 A1 | 9/2012 | Lee et al. | |
| 2012/0243837 A1 | 9/2012 | Ko et al. | |
| 2012/0246373 A1 | 9/2012 | Chang | |
| 2012/0251116 A1 | 10/2012 | Li et al. | |
| 2013/0005178 A1 | 1/2013 | Straka et al. | |
| 2013/0012038 A1 | 1/2013 | Kirk et al. | |
| 2013/0017715 A1 | 1/2013 | Laarhoven et al. | |
| 2013/0040482 A1 | 2/2013 | Ngo et al. | |
| 2013/0092429 A1 | 4/2013 | Ellison | |
| 2013/0148321 A1 | 6/2013 | Liang | |
| 2013/0340251 A1 | 12/2013 | Regnier et al. | |
| 2014/0041937 A1 | 2/2014 | Lloyd et al. | |
| 2014/0073173 A1 | 3/2014 | Yang | |
| 2014/0073174 A1 | 3/2014 | Yang | |
| 2014/0073181 A1 | 3/2014 | Yang | |
| 2014/0111293 A1 | 4/2014 | Madeberg et al. | |
| 2014/0148048 A1 | 5/2014 | Shinohara | |
| 2014/0217571 A1 | 8/2014 | Ganesan et al. | |
| 2014/0242844 A1 | 8/2014 | Wanha et al. | |
| 2014/0273551 A1 | 9/2014 | Resendez et al. | |
| 2014/0273594 A1 | 9/2014 | Jones et al. | |
| 2014/0335736 A1 | 11/2014 | Regnier et al. | |
| 2015/0013936 A1 | 1/2015 | Mack | |
| 2015/0079845 A1 | 3/2015 | Wanha et al. | |
| 2015/0090491 A1 | 4/2015 | Dunwoody et al. | |
| 2015/0180578 A1 | 6/2015 | Leigh et al. | |
| 2015/0207247 A1 | 7/2015 | Regnier et al. | |
| 2015/0212961 A1 | 7/2015 | Wu | |
| 2015/0289407 A1 | 10/2015 | Wu et al. | |
| 2016/0013596 A1 | 1/2016 | Regnier | |
| 2016/0064119 A1 | 3/2016 | Grant et al. | |
| 2016/0104956 A1 | 4/2016 | Santos et al. | |
| 2016/0181713 A1 | 6/2016 | Peloza et al. | |
| 2016/0190720 A1 | 6/2016 | Lindkamp et al. | |
| 2016/0190747 A1 | 6/2016 | Regnier et al. | |
| 2016/0197423 A1 | 7/2016 | Regnier | |
| 2016/0218455 A1 | 7/2016 | Sayre et al. | |
| 2016/0233598 A1 | 8/2016 | Wittig | |
| 2016/0233615 A1 | 8/2016 | Scholeno | |
| 2016/0336692 A1 | 11/2016 | Champion et al. | |
| 2016/0380383 A1 | 12/2016 | Lord et al. | |
| 2017/0033482 A1 | 2/2017 | Liao | |
| 2017/0033509 A1 | 2/2017 | Liao | |
| 2017/0077621 A1 | 3/2017 | Liao | |
| 2017/0098901 A1 | 4/2017 | Regnier | |
| 2017/0110222 A1 | 4/2017 | Liptak et al. | |
| 2017/0162960 A1 | 6/2017 | Wanha et al. | |
| 2017/0302036 A1 | 10/2017 | Regnier et al. | |
| 2017/0365942 A1 | 12/2017 | Regnier | |
| 2018/0034175 A1 | 2/2018 | Lloyd et al. | |
| 2018/0120906 A1 | 5/2018 | Reed et al. | |
| 2019/0027870 A1 | 1/2019 | Lloyd et al. | |
| 2019/0319380 A1 | 10/2019 | Lloyd et al. | |

FOREIGN PATENT DOCUMENTS

| | | | |
|---|---|---|---|
| CN | 2415473 Y | 1/2001 | |
| CN | 1316802 A | 10/2001 | |
| CN | 1336095 A | 2/2002 | |
| CN | 2624465 Y | 7/2004 | |
| CN | 1604398 A | 4/2005 | |
| CN | 1647323 A | 7/2005 | |
| CN | 1647599 A | 7/2005 | |
| CN | 101155037 A | 4/2008 | |
| CN | 101656384 A | 2/2010 | |
| CN | 101944697 A | 1/2011 | |
| CN | 102074825 A | 5/2011 | |
| CN | 102365907 A | 2/2012 | |
| CN | 102986316 A | 3/2013 | |
| CN | 103168396 A | 6/2013 | |
| CN | 203871546 U | 10/2014 | |
| DE | 3447556 A1 | 7/1986 | |
| JP | H10145767 A | 5/1998 | |
| JP | 2001244661 A | 9/2001 | |
| JP | 2001313109 A | 11/2001 | |

(56) References Cited

FOREIGN PATENT DOCUMENTS

| | | | |
|---|---|---|---|
| JP | 2002079571 A | 3/2002 | |
| JP | 2004014372 A | 1/2004 | |
| JP | 2005059761 A | 3/2005 | |
| JP | 2005222537 A | 8/2005 | |
| JP | 2007287380 A | 11/2007 | |
| JP | 2008041285 A | 2/2008 | |
| JP | 2008059857 A | 3/2008 | |
| JP | 2009043590 A | 2/2009 | |
| JP | 2010017388 A | 1/2010 | |
| JP | 2010112789 A | 5/2010 | |
| JP | 2010123274 A | 6/2010 | |
| JP | 2011018673 A | 1/2011 | |
| JP | 2011103442 A | 5/2011 | |
| JP | 2013016394 A | 1/2013 | |
| JP | 2013524443 A | 6/2013 | |
| JP | 2014045080 A | 3/2014 | |
| JP | 2014204057 A | 10/2014 | |
| JP | 2014531723 A | 11/2014 | |
| KR | 20170104567 A | 9/2017 | |
| TW | M359141 U | 6/2009 | |
| TW | M408835 U | 8/2011 | |
| TW | 201225455 A | 6/2012 | |
| WO | 2008072322 A1 | 6/2008 | |
| WO | 2009147791 A1 | 12/2009 | |
| WO | 2012078434 A2 | 6/2012 | |
| WO | 2013006499 A2 | 1/2013 | |
| WO | 2013006592 A2 | 1/2013 | |
| WO | 2016112379 A1 | 7/2016 | |
| WO | 2017123574 A1 | 7/2017 | |
| WO | 2017127513 A1 | 7/2017 | |

OTHER PUBLICATIONS

Agilent, "Designing Scalable 10G Backplane Interconnect Systems Utilizing Advanced Verification Methodologies," White Paper, Published, May 5, 2012.

Amphenol Aerospace, "Size 8 High Speed Quadrax and Differential Twinax Contacts for Use in MIL-DTL-38999 Special Subminiature Cylindrical and ARINC 600 Rectangular Connectors", Retrieved from the Internet, May 2008.

Amphenol TCS, "Amphenol TCS expands the XCede Platform with 85 Ohm Connectors and High-Speed Cable Solutions," Press Release, Retrieved from the Internet, Feb. 25, 2009.

Decision to grant received for KR Application No. 10-2018-7022801 dated Jan. 14, 2020, 2 pages (1 page of English translation and 1 page of official copy).

Decision to Grant received for related JP application No. 2019-149015 dated Nov. 10, 2020, 5 pages. (2 pages of English translation and 3 pages of Official copy).

First Office Action and Search Report received for related CN application No. 201780007317.X, dated Apr. 9, 2019, 9 pages. (4 pages of English translation and 5 pages of Official copy).

First Office Action and Search Report received for related CN application No. 201910933045.7, dated Jun. 12, 2020, 19 pages. (10 pages of English translation and 09 pages of Official copy).

Hitachi Cable America Inc., "Direct Attach Cables: OMNIBIT supports 25 Gbit/s interconnections". Retrieved from the Internet, Aug. 10, 2017.

International Preliminary Report on Patentability received for PCT Application No. PCT/US2016/012848, dated Jul. 20, 2017, 10 pages.

International Preliminary Report on Patentability received for PCT Application No. PCT/US2017/012917, dated Jul. 26, 2018, 9 pages.

International Search Report and Written Opinion received for PCT application No. PCT/US2016/012848, dated Apr. 25, 2016, 11 pages.

International Search Report and Written Opinion received for PCT application No. PCT/US2017/012917, dated Mar. 31, 2017, 10 pages.

Non-Final Rejection for U.S. Appl. No. 15/561,852, dated Aug. 28, 2018, 7 pages.

Notice of Allowance received for Japanese Application No. 2018-536097, dated May 28, 2019, 5 pages. (2 pages of English translation and 3 pages of Official copy).

Notice of Allowance received for U.S. Appl. No. 16/823,333, dated Apr. 29, 2021, 11 Pages.

Notice of Allowance received for U.S. Appl. No. 16/823,333, dated Mar. 10, 2021, 12 Pages.

Notification of Reasons for Refusal received for related JP application No. 2018-536113 dated Jul. 9, 2019, 6 pages. (3 pages of English translation and 3 pages of Official copy).

Notification of Reasons for Refusal received for related JP application No. 2019-118731, dated Sep. 8, 2019, 4 pages. (2 pages of English translation and 2 pages of Official copy).

U.S. Appl. No. 61/714,871, filed Oct. 17, 2012, 53 pages.

\* cited by examiner

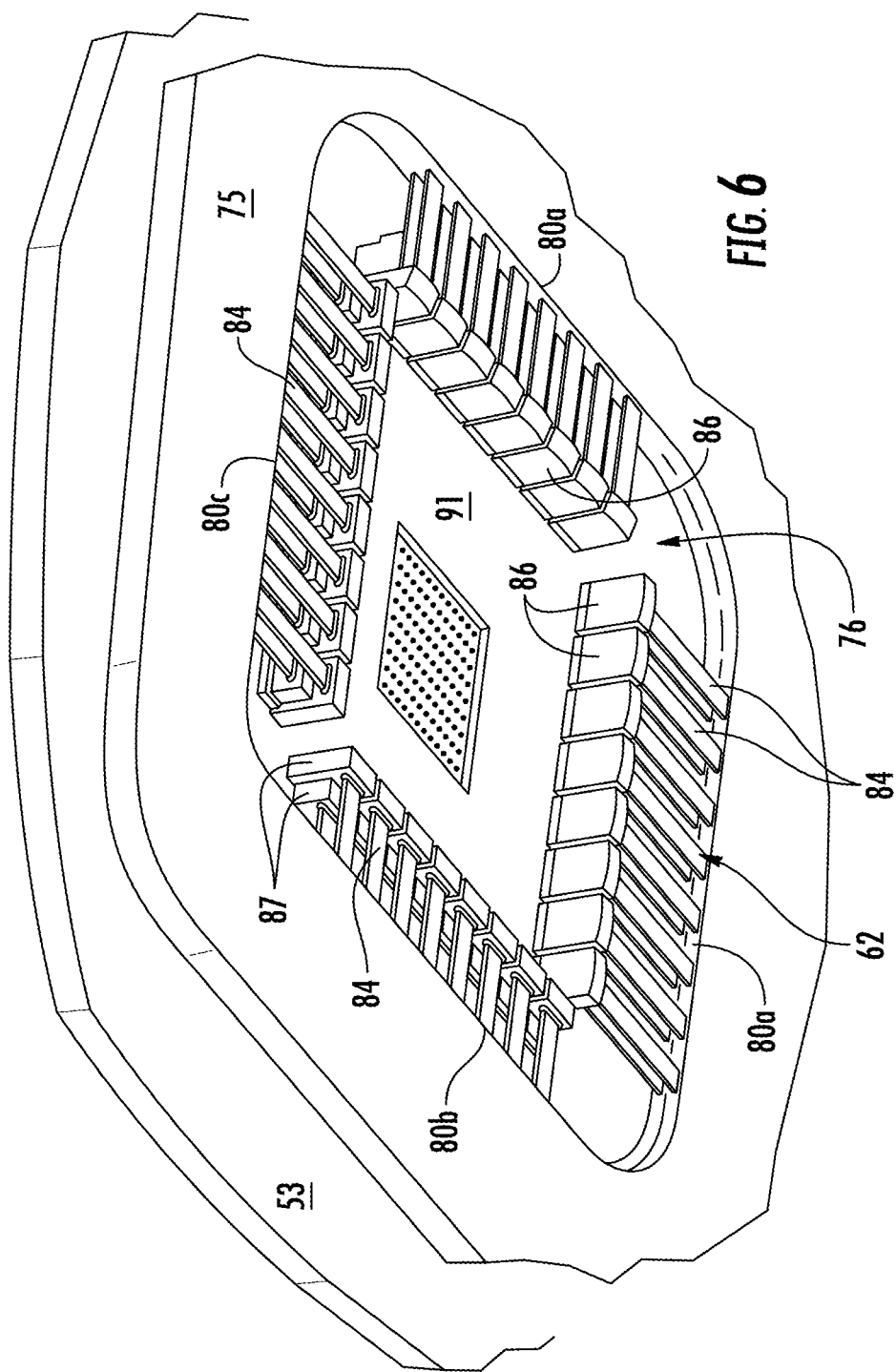

— ROUTING ASSEMBLY AND SYSTEM USING SAME —

REFERENCE TO RELATED APPLICATIONS

This application is a continuation of U.S. Ser. No. 17/012,079, filed Sep. 4, 2020, now U.S. Pat. No. TBD, which is a continuation of U.S. Ser. No. 16/454,080, filed Jun. 27, 2019, now U.S. Pat. No. 10,797,416, which is a continuation of U.S. Ser. No. 15/561,852, filed Sep. 26, 2017, now U.S. Pat. No. 10,424,856, which is a national phase of PCT Application No. PCT/US2017/012917, filed Jan. 11, 2017, all of which are incorporated herein by reference in their entirety and which in turn claims priority to U.S. Provisional Application Ser. No. 62/277,275, filed Jan. 11, 2016.

BACKGROUND OF THE DISCLOSURE

The Present Disclosure relates generally to high speed data transmission systems suitable for use in transmitting high speed signals at low losses from chips or processors of a chip package to backplane and input/output (I/O) connectors, and more particularly to an integrated connector interface-chip package routing assembly that is structured to fit within the housing of an electronic device and provide multiple data transmission channels that lead directly from the chip/processor to an array of external connectors.

Electronic devices such as routers, servers, switches and the like need to transmit data at high data transmission speeds in order to serve the rising need for bandwidth and delivery of streaming audio and video in many end user devices. Chips are the heart of these routers, switches and other devices. These chips typically include a processor such as an ASIC (application specific integrated circuit) or an FPGA (field programmable gate array) and the like, these chips have dies that are typically connected to a substrate (creating a package) by way of conductive solder bumps or other convenient connection. The package may include micro-vias or plated through holes that extend through the substrate to solder balls. These solder balls comprise a ball grid array by which the package is attached to the motherboard. The motherboard includes numerous traces formed in it that define transmission lines which include differential signal pairs for the transmission of high speed data signal, ground paths associated with the differential signal pairs, and a variety of low speed transmission lines for power, clock and logic signals as well as other components. These traces include traces that are routed from the ASIC to the I/O connectors of the device into which external connectors are connected to provide a connection between one or more external plug connectors and the chip member. Other traces are routed from the ASIC to backplane connectors that permit the device to be connected to an overall system such as a network server or the like.

These conductive traces thus form transmission lines as part of the mother board and extend between the chip member and connectors to provide that provides a connection between one or more external plug connectors and the chip member. Circuit boards are usually formed from a material known as FR4, which is inexpensive. Although inexpensive, FR4 is known to promote losses in high speed signal transmission lines that transfer data at rates of about 6 Gbps and greater. These losses increase as the speed increases and therefore make FR4 material undesirable for the high speed data transfer applications of about 10 Gbps and greater. This drop off begins at about 6 Gbps (or 3 GHz using NRZ encoding) and increases as the data rate increases. In order to use such traces in FR4, a designer may have to utilize amplifiers and equalizers, which increase the final cost of the device.

Custom materials for circuit boards, such a MEGATRON, are available that reduce such losses, but the prices of these materials substantially increase the cost of the circuit board and, consequently, the electronic devices in which they are used. Additionally, when traces are used to form signal transmission lines, the overall length of the transmission lines can exceed threshold lengths at which problems to appear in operation. These lengths may approach 10 inches and longer in length and may include bends and turns that can create reflection and noise problems as well as additional losses. Losses can sometimes be corrected by the use of amplifiers, repeaters and equalizers but these elements increase the cost of manufacturing the circuit board. Do so, however, complicates the design inasmuch as additional board space is needed to accommodate these amplifiers and repeaters. In addition, the routing of the traces of such a transmission line may require multiple turns. These turns and the transitions that occur at terminations affect the integrity of the signals transmitted thereby. These custom circuit board materials thus become more lossy at frequencies above 10 Ghz than cable transmission lines. It then becomes difficult to route transmission line traces in a manner to achieve a consistent impedance and a low signal loss therethrough.

It therefore becomes difficult to adequately design signal transmission lines in circuit boards and backplanes to meet the crosstalk and loss requirements needed for high speed applications. Accordingly, certain individuals would appreciate an integrated, high speed, connector interface-chip package routing assembly that provides transmission lines for transmitting high speed data signals (above 20 Gbps) without using traces on the circuit board.

SUMMARY OF THE DISCLOSURE

A routing assembly has an overall L-shaped configuration that includes a frame with a front plate and a tray, both of which may be formed of insulative or conductive materials and the front plate extends vertically while the tray extends horizontally. The frame may further include a pair of support arms disposed at one end of the tray. The support arms can be mounted on the front plate and structurally support the tray. The front plate includes a plurality of connector ports and a plurality of first connectors are positioned in the connector ports. Cables have first ends that are terminated to the plurality of first connectors and extend and are supported by the tray in a routing configuration. Second ends of the cables extend from the tray and are terminated to second connectors. The second connectors are configured to be connected to a circuit board and/or chip package (or adjacent such chip package) so as to substantially avoid using a circuit board to route high speed signal traces between the chip package and the first connectors. The first connectors, frame, cables and second connectors connector are integrated into the routing assembly as a single piece, so that the assembly can readily inserted into the electronic device as one piece.

To provide flexibility in configuration, the tray may be positioned either above or below the motherboard of the host device. The tray may include an opening that is aligned with a chip package. If the second connectors are low profile style connectors then the connection between the second connectors and the structure that supports a processor in the chip package can be configured to be substantially within the opening so as to minimize space requirements.

The routing assembly preferably utilizes cables of the twin-ax variety for transmitting differential signals from the chip package to the connector ports. The cables may be free in their extent toward the chip package and secured to the tray by way of clips or the like, or they may be embedded or encased within the body of the tray extending from a front end of the tray to the chip-receiving opening where the conductors of the cables are terminated to connectors that will mate with corresponding opposing connectors associated with the chip package. The embedding of the cables in the body of the tray protects the twin-ax cables from damage during assembly.

The second connectors can be configured to have a mating direction that is transverse to the tray and can have a plug and play aspect such that rows of second connectors fit in place over the rows of second connectors. Preferably the second connectors are flexibly supported by the tray so that they may be manipulated into engagement with opposing connectors on the motherboard and/or chip package.

The stacking of the connector ports provides a vertical space rearward of the connector ports that can accommodate a larger heat transfer member that may be directly contacted to the chip package, thus potentially improving thermal issues. Naturally, the use of cables also significantly reduces loses compared to conventional construction. In addition, the overall structure provides a system that can readily be positioned in a switch or server, thus improving installation. These and other features and advantages will be clearly understood through a consideration of the following detailed description.

BRIEF DESCRIPTION OF THE DRAWINGS

The present disclosure is illustrated by way of example and not limited in the accompanying Figures in which like reference numerals indicate similar elements and in which:

FIG. 6 is an enlarged view of the routing assembly chip package opening illustrating the arrangement of second connectors and a corresponding chip package;

DETAILED DESCRIPTION

The detailed description that follows describes exemplary embodiments and is not intended to be limited to the expressly disclosed combination(s). Therefore, unless otherwise noted, features disclosed herein may be combined together to form additional combinations that were not otherwise shown for purposes of brevity.

The present disclosure is therefore directed to an integrated routing assembly that is structured to fit within the housing of an electronic device as a single element and provide multiple data transmission channels that lead directly from a chip or processor (of the ASIC or FPGA type) to an array of external connectors. The transmission channels take the form of cables fixed in place within the routing assembly, thereby eliminating the need to route the high speed channels by way of high-speed traces on a motherboard of the host device.

Figure 1:
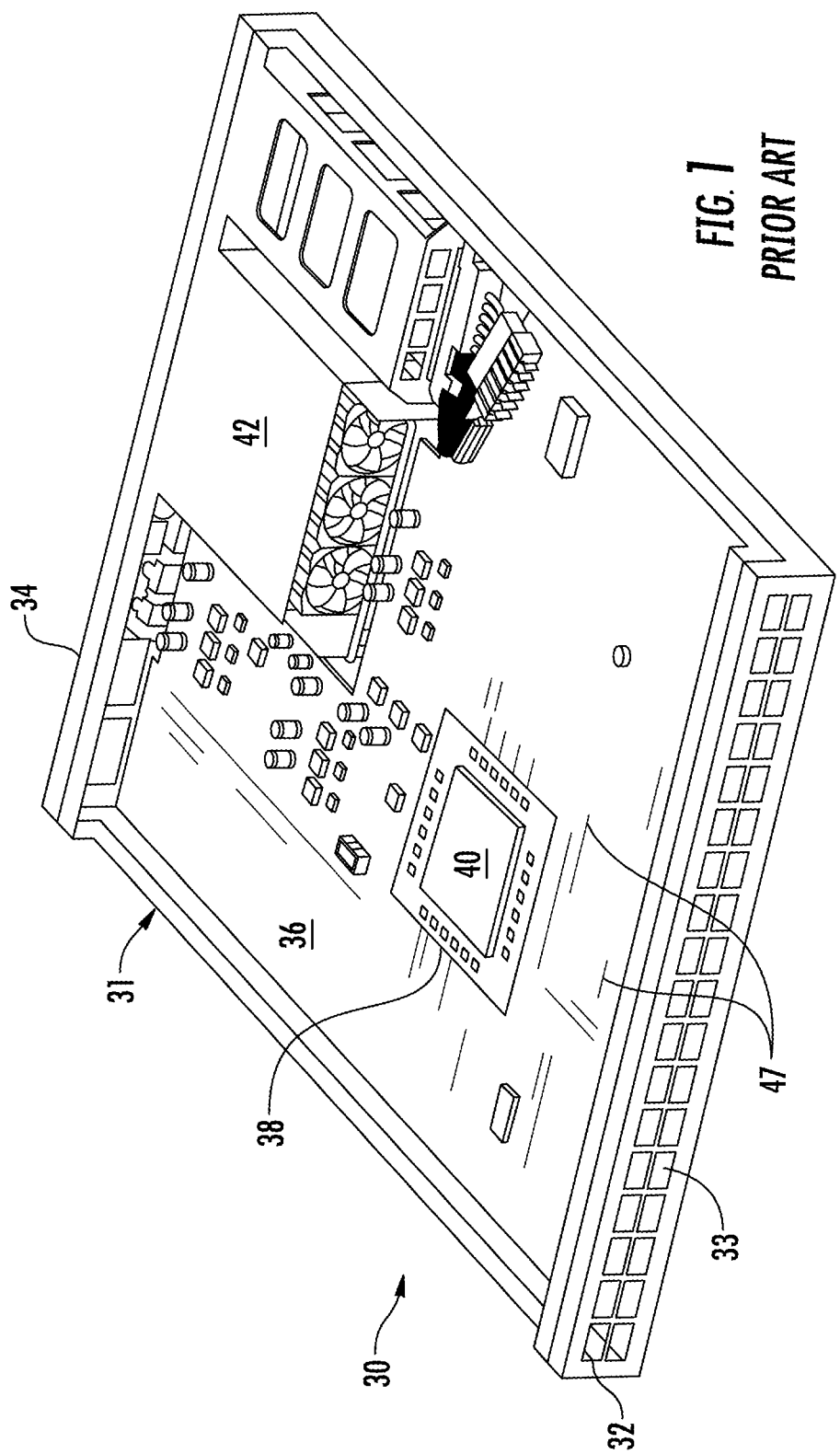
FIG. 1 is a perspective view of the interior of a prior art electronic device with a chip package in place upon a motherboard.
Figure 1A:
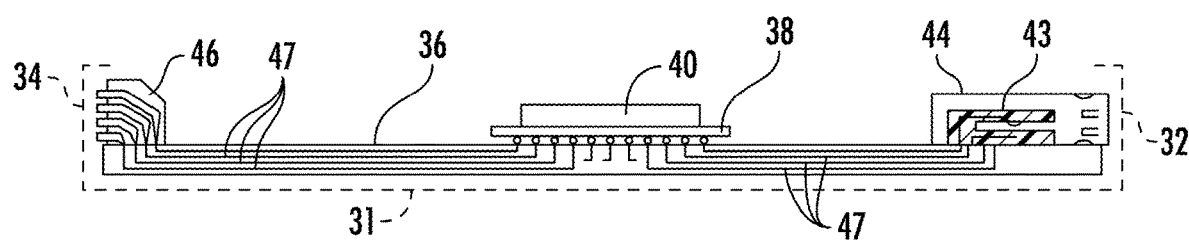
FIG. 1A is a schematic sectional view of the electronic device of FIG. 1 illustrating how the circuit board is used for routing signal transmission channels between the chip package and the external connector interfaces of the device.

FIG. 1 illustrates a conventional electronic device 30, such as a router, switch, etc. that has a sheet metal housing 31 with a front wall 32 and an opposing rear wall 34. The device 30 supports within the housing, a motherboard 36 that includes various electronic components such as a chip package 38 with an associated processor 40, a power supply 42 and additional integrated circuits, connectors, capacitors, resistors, etc. The front wall 32 has a series of openings 33 that are aligned with first connectors 43 to define connector ports for the device 30. Typically, as shown in FIG. 1A, an array of first connectors 43 are mounted to the motherboard 36 at the front end thereof and enclosed within metal shielding cages 44, or adapter frames, that are placed over the connectors 43 and onto the motherboard 36. Likewise, a series of second connectors 46 are mounted along the rear edge of the motherboard 36 and aligned with openings in the rear wall of the housing 31.

In the known structure of the device of FIG. 1, the chip package 38 is connected to the first and second connectors by way of lengthy conductive traces 47 that extend from the chip package contacts through the motherboard 36 to the connectors 43, 46. Pairs of conductive traces 47 are required to define each differential signal transmission line and a third conductive trace can be used to provide an associated ground that follows the path of the signal transmission line. Each such signal transmission line is routed through or on the motherboard and such routing has certain disadvantages. FR4 is the material that is commonly used for circuit boards, and unfortunately, it becomes increasingly lossy at frequencies above 5 Ghz. Turns, bends and crossovers of these signal transmission line traces 47 are usually required to route the transmission line on the motherboard from the chip package contacts to the connectors. These directional changes in the traces can create signal reflection and noise problems, as well as additional losses. Although losses can sometimes be corrected by the use of amplifiers, repeaters and equalizers, these elements increase the cost of manufacturing of the final circuit (mother) board as well as increasing power consumption (and the cost of operation). The use of such components also complicates the layout of the circuit board because additional board space is needed to accommodate such amplifiers and repeaters and this additional board space may not be available in the intended size of the device. Custom materials for circuit boards are available that are less lossy, but the cost of these materials increase the cost of the circuit board and, consequently, the host devices in which they are used. Still further, lengthy circuit traces require increased power to drive high speed signals through them and, as such, they hamper efforts by designers to develop "green" (energy-saving) devices.

In order to overcome these actual disadvantages, we have developed an integrated routing assembly 50 that incorporates the external connector interfaces of a host device 51 into a single assembly and which provides a support for high speed differential pair signal transmission lines in the form of elongated cables 62 that extend between the connector interfaces and the chip package 88, which includes a processor 90 and may include a substrate 91, eliminating the need for high speed routing traces on the motherboard 53. Such an assembly is illustrated at 50 in FIG. 2. The assembly 50, as shown in FIGS. 2-8B, includes a front portion that accommodates a plurality of first and second connectors 55, 57 and their associated connector housings 60 in preselected arrays, which are illustrated as four horizontal rows of connector housings 60 that are stacked vertically upon each other.

The connector housings 60 define the external connector interfaces for the device 50 in the form of connector ports 54, 56 and each such connector housing 60 contains a first connector 55, 57 preferably of the receptacle style. In some instances, as illustrated, connectors ports 56 may be I/O connector ports arranged in housings 60 along a front of the host device 51 but the location and type of connector ports is not intended to be limited unless otherwise noted.

Figure 2:
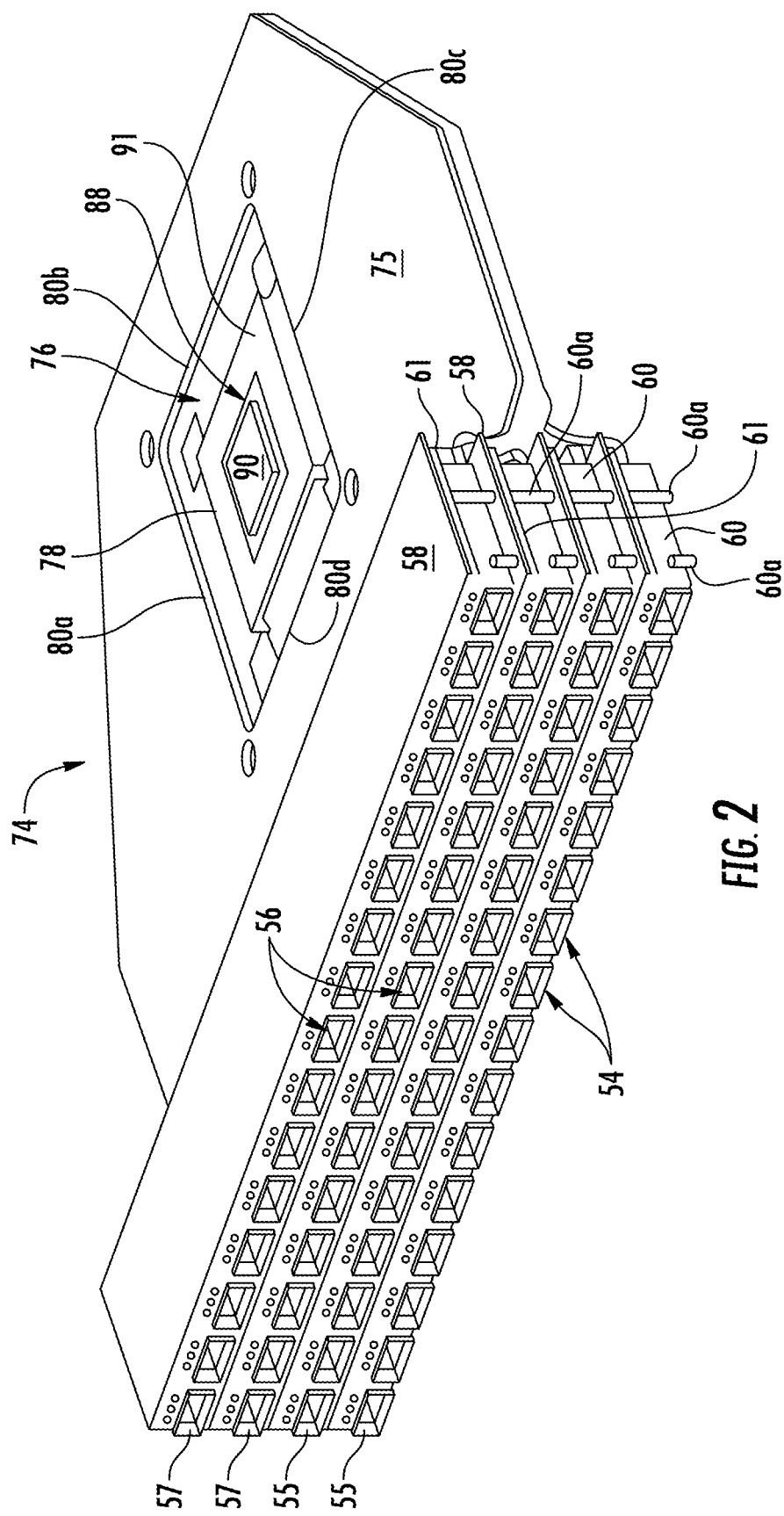
FIG. 2 is a perspective view of an embodiment of a routing assembly.

As can be appreciated, the connectors 55, 57 can be arranged in horizontal rows in an integrated fashion as in FIG. 2, where the connector housings 60 and associated heat sinks 61 are held in their horizontal extent and vertical alignment between support boards 58, by way of fasteners such as screws that extend through bosses 60a formed on the exterior of the connector housings 60. Such an arrangement can easily accommodate a face plate 70 (FIG. 3) that extends widthwise between two side supports 68 and the face plate 70 and the side supports 68 cooperatively form a frame 66. The side supports 68 have rearwardly extending channels 72a, 72b that help support a tray 75 in a cantilevered manner. The frame 66 and the tray 75 define a routing assembly 74.

As depicted, the routing assembly 74 has a substantially L-shaped configuration that can be internally supported and can be inserted into a housing. It should be noted that the depicted configuration is based on the use of connector housings 60 formed via a cast construction. Alternatively, as is known, the connector housing can be formed from sheet metal that is formed in a desired construction, typically with multiple pieces being intertwined together to form the desired structure. The use of sheet metal versus cast to form a connector housing is well known and thus further discussion is not required herein.

Figure 4:
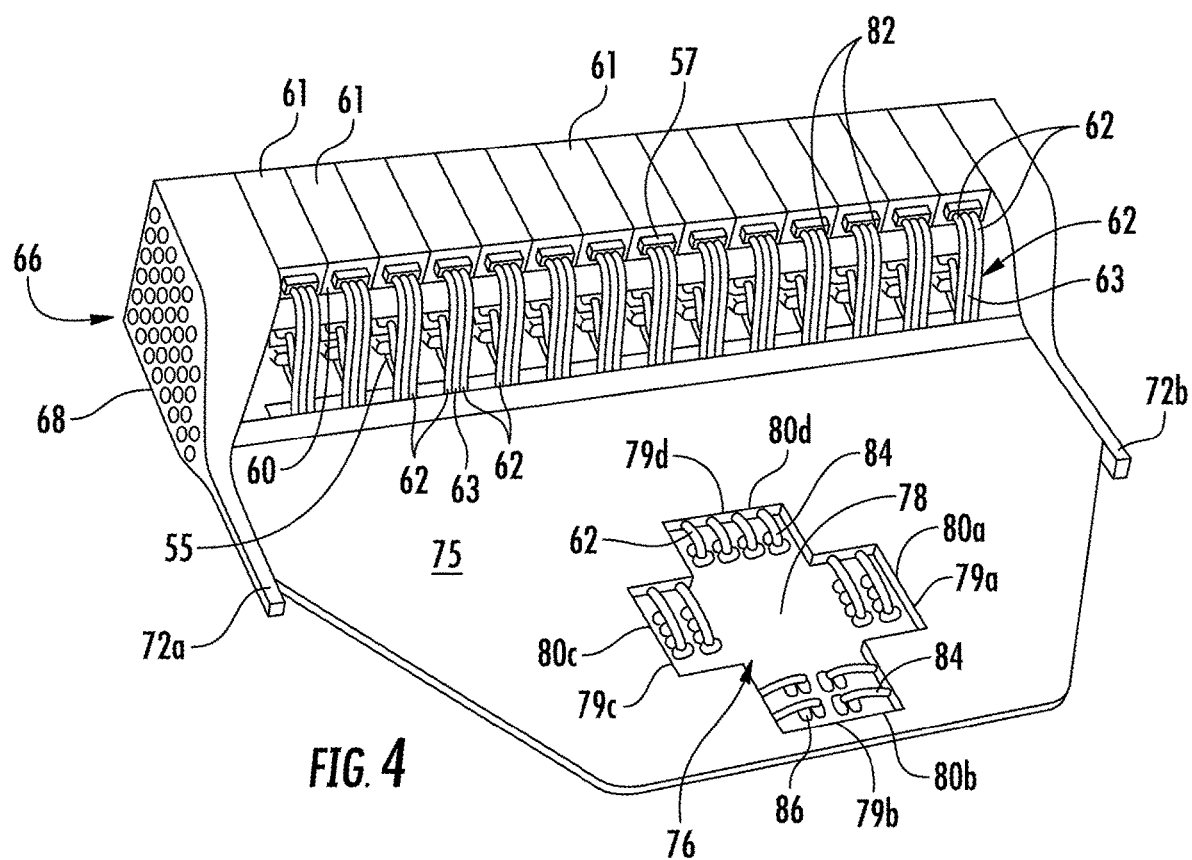
FIG. 4 is a perspective view of an embodiment of a routing assembly with an opening formed in the tray.
Figure 4A:
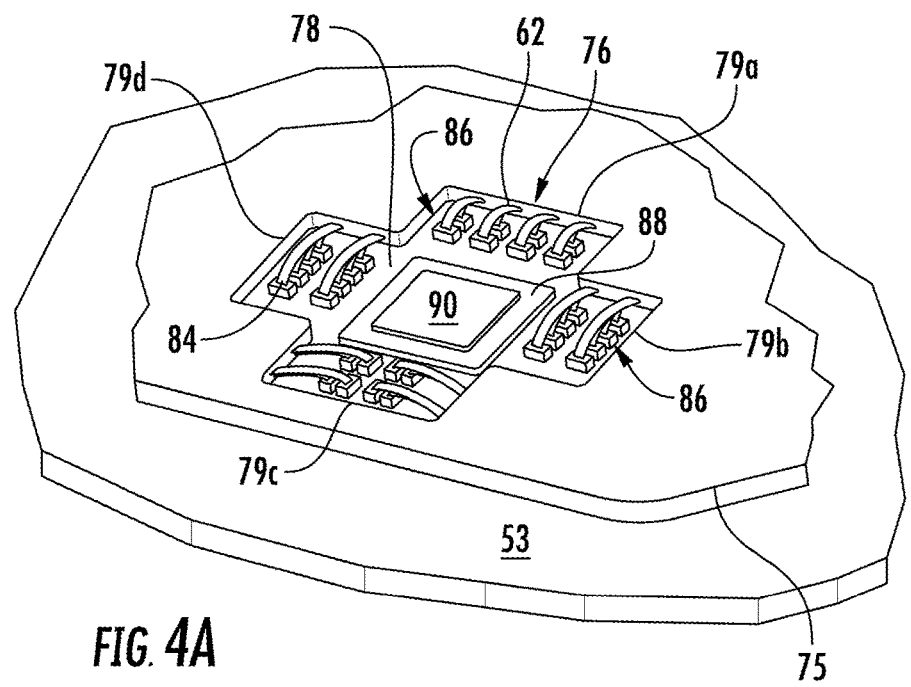
FIG. 4A is an enlarged view of the opening depicted in FIG. 4 with a chip package positioned in the opening.

The tray 75, as illustrated in FIG. 4 is generally planar and has a predetermined thickness and can be formed of insulative and/or conductive materials. As can be appreciated, conductive materials can provide additional shielding and thus may be desired in certain applications. The depicted tray 75 has a tray opening 76 formed therein, which is shown in the Figures as located within the perimeter of the tray 75. The tray opening 76 is shown in the Figures as having two distinct shapes and each opening has a central portion 78 that may be square or rectangular in configuration with four edges 80a-d or it may have a cruciform configuration as illustrated in FIGS. 4 & 4A in which the tray opening 76 includes four wing portions 79a-79d that communicate with the opening central portion 78 and which incorporate the four edges 80a-80d of the tray opening 76. Naturally, for versions where the tray 75 does not extend past and thus fully enclose the chip package the tray opening 76 may be replaced with a notch in the tray 75 or just the end of the tray 75.

Figure 7:
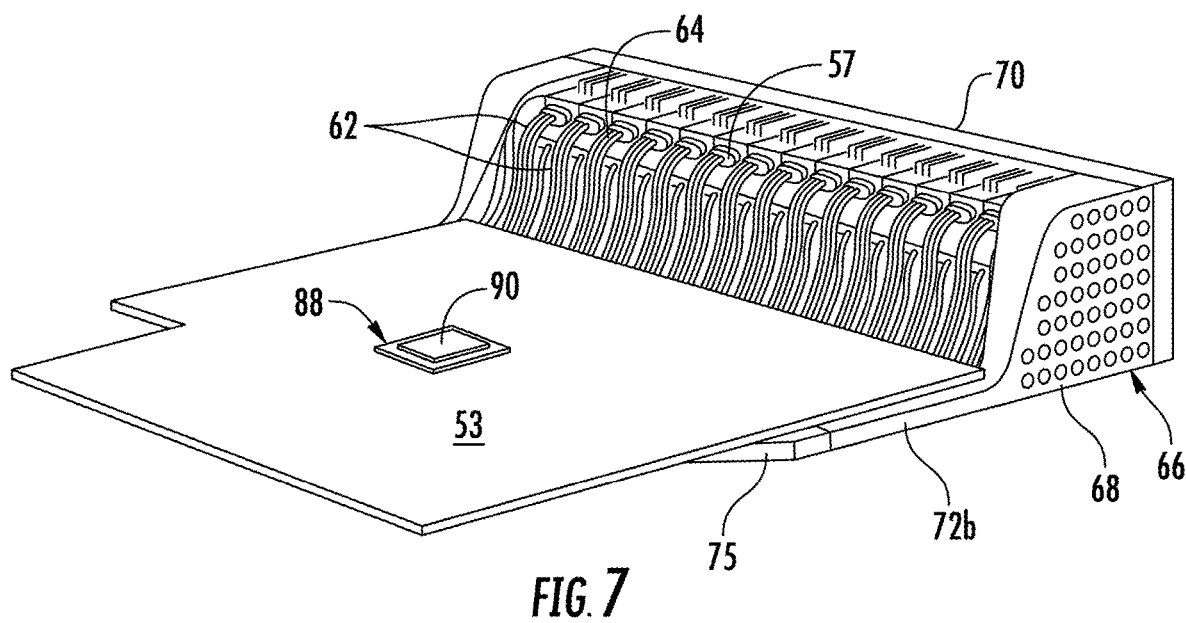
FIG. 7 is a perspective view of an embodiment of a routing assembly in place underneath a motherboard.
Figure 8:
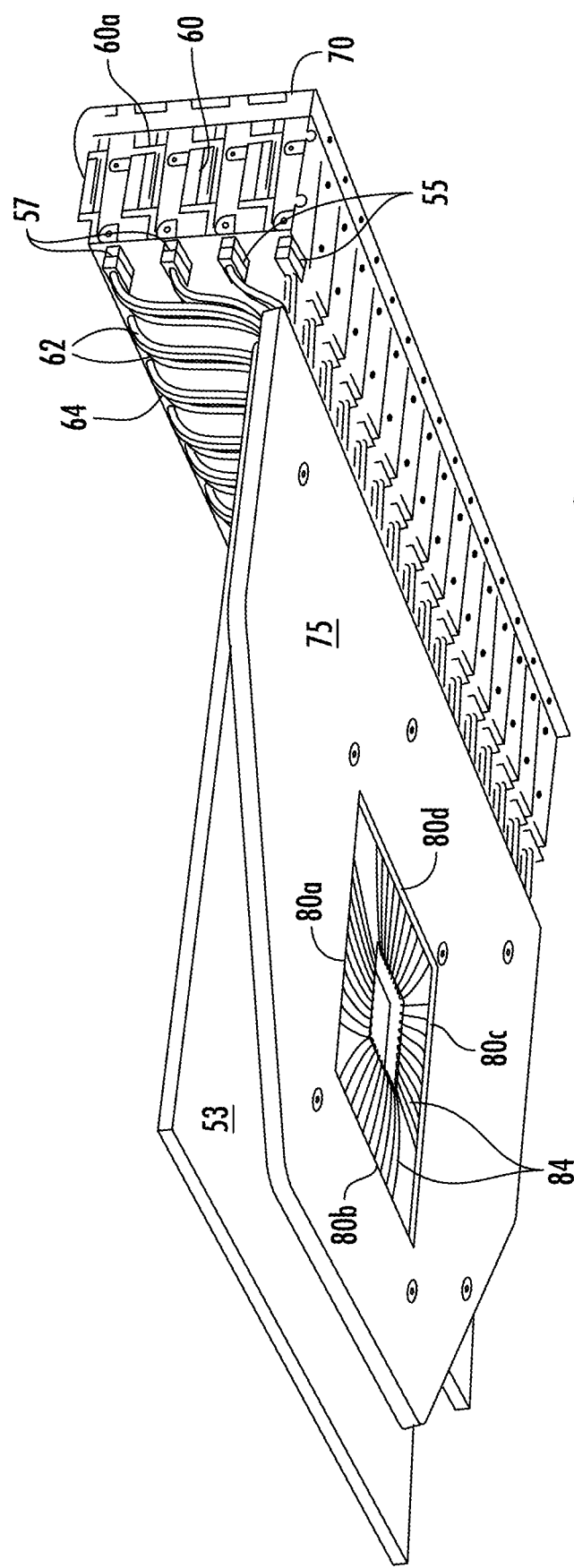
FIG. 8 is another perspective view of the embodiment depicted in FIG. 7.

The connectors 55, 57 that are positioned in the N by M array of connector ports 54, 56 (where both N and M can be two or more) are not shown in detail but can be any desired receptacle type having signal and ground terminals arranged in transmit and receive channel configurations to mate with opposing connectors having a plug style. For example, SFP style, QSFP style and CFP style connectors are just a few of many possible alternatives and the connectors 55, 57 are not intended to be limited to particular style of connector. It should also be noted that a single row of connectors 57 could be provide if desired. Cables 62 can be directly terminated to the terminals of each connector 55, 57 at first ends 82 of the cables 62 and are seen in FIGS. 4, 7 & 8 as being adjacent low speed wires 63 (which can be used for logic, clock, power and other circuits). The cables 62 preferably includes a pair of signal conductors in a desired spacing that are surrounded by a dielectric covering and may include an associated drain wire and/or an outer conductive covering that are enclosed in an insulative outer jacket so as to form a transmission line. The cables 62 help maintain the ordered geometry of the signal conductors throughout their lengths as they traverse from the chip package 88 to the connectors 55, 57. Because this geometry remains ordered through their length, the cables 62 may easily be turned or bent or crossed in their paths without introducing problematic signal reflection or impedance discontinuities into the transmission lines.

Figure 8A:
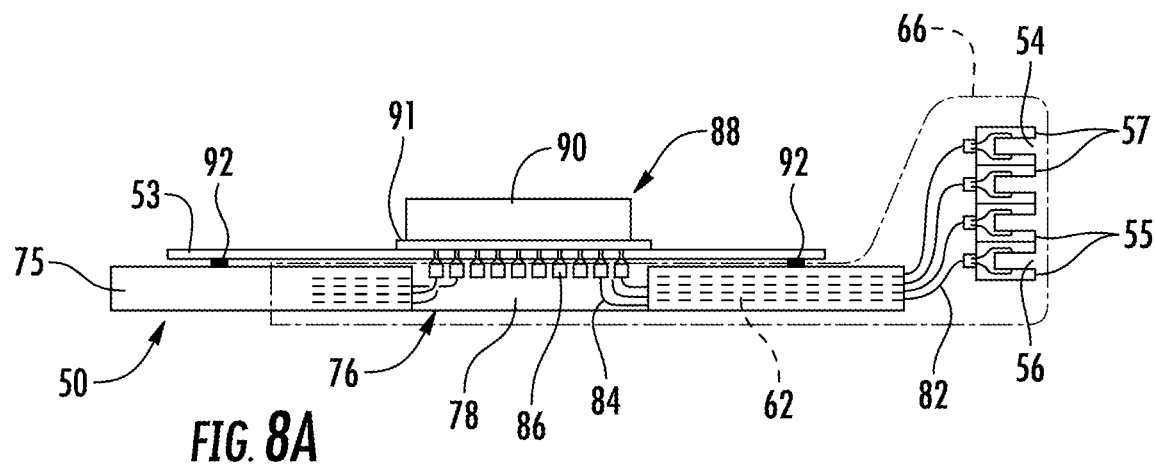
FIG. 8A is a schematic sectional view of the routing assembly depicted in FIG. 8.
Figure 8B:
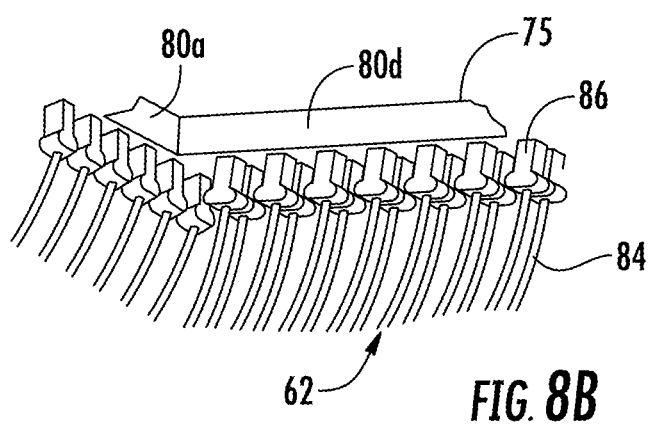
FIG. 8B is a perspective view of an embodiment of second connectors suitable for use in connecting to a chip package.
Figure 9:
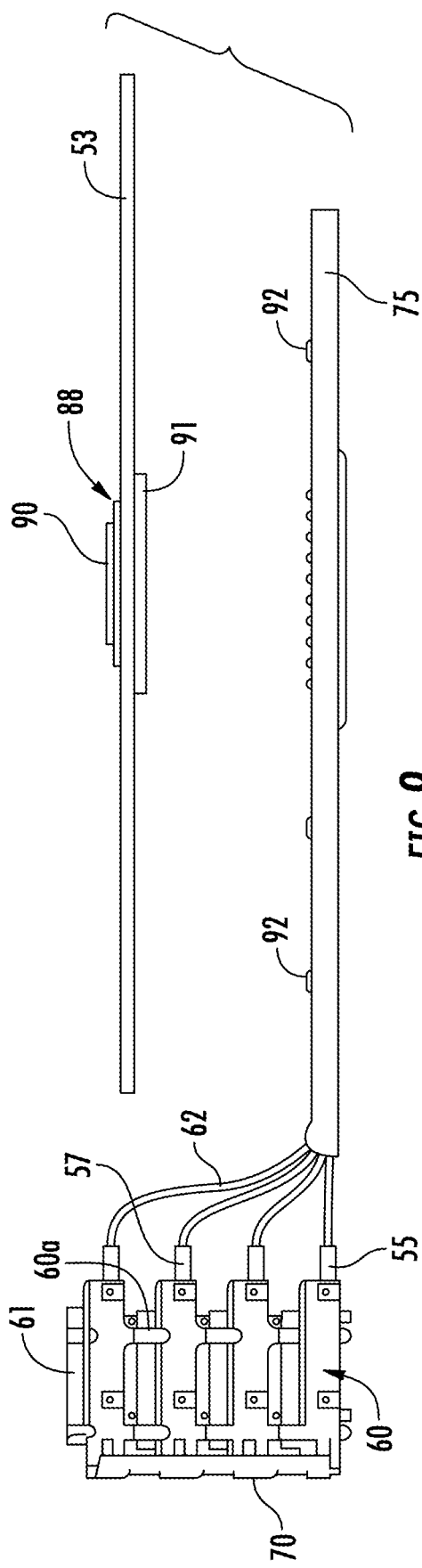
FIG. 9 is an elevational side view of a motherboard and chip package in position for mating with an embodiment of a routing assembly.
Figure 9A:
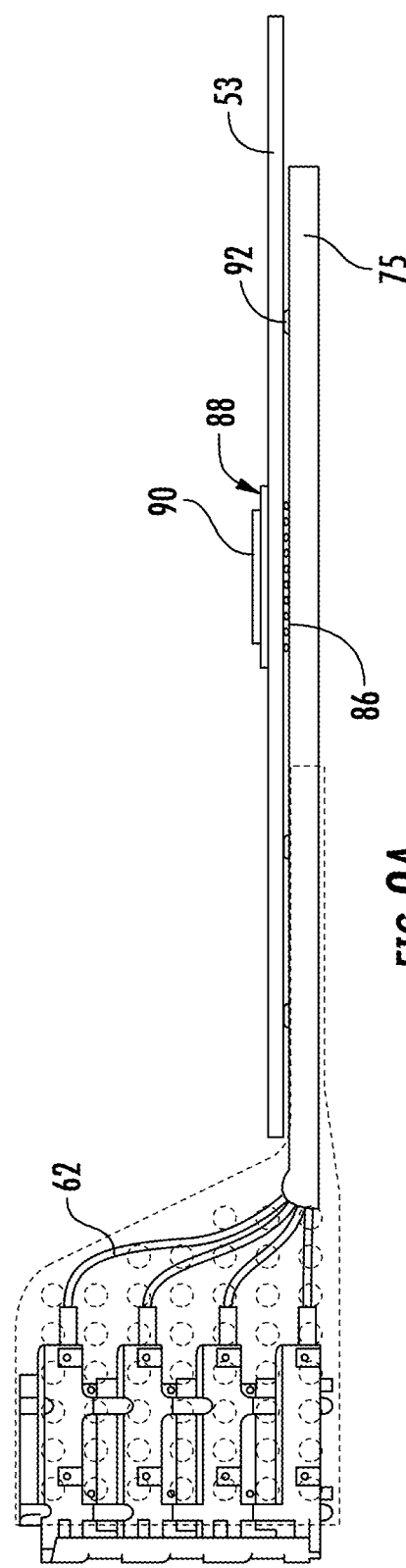
FIG. 9A is an elevated side view of the embodiment depicted in FIG. 9 but with the motherboard position on the tray and the side support members of the routing assembly frame shown in phantom.

Both the cables 62 and low speed wires 63 are terminated directly at their first ends 82 to the connectors 55, 57. This make it possible to eliminate a direct connection with the motherboard 53 and allows for structures that can be readily stacked while still providing acceptable air flow and while avoiding impedance discontinuities which normally occur at a connector-circuit board mounting interface. The cables 62 are illustrated as arranged in rows at the rear of the connector housings 60. The cables 62 are arranged in rows as best shown in FIGS. 8A, 9 & 9A, with the cables 62 and low speed wires 63 of the lower connector housing rows arranged inwardly of the topmost connector housing row. This promotes orderly arrangement of the cables 62 from the connectors 55, 57 to the tray 75. In the assembly 50 depicted (in FIGS. 9 and 9A) the cables 62 associated with the top three rows of connectors 54, 56 and connector ports 55, 57 are seen to have a general S-shaped configuration extending downward to the level of the tray 75 and into the substrate at the front end thereof, while the cables in the bottommost row extend almost horizontally into the tray 75.

Figure 2A:
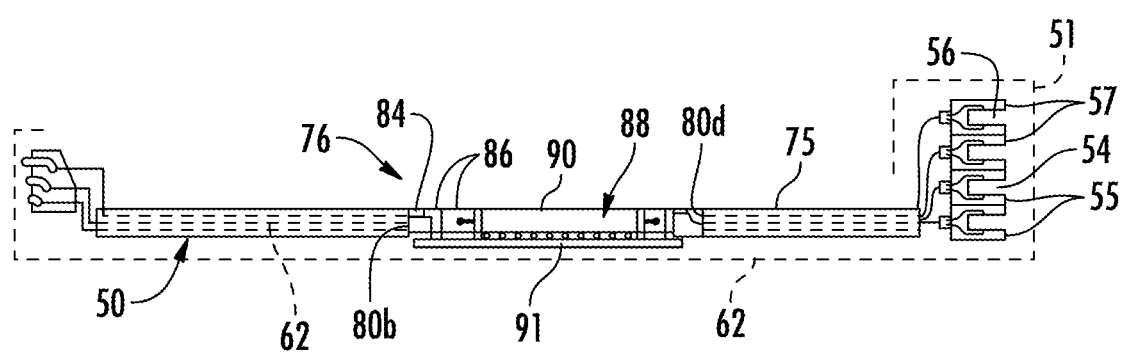
FIG. 2A is a schematic sectional view of the routing assembly of FIG. 2 illustrating how the cables can be embedded within the tray for routing signals between a chip package substrate and the external connector interfaces of the assembly.
Figure 5:
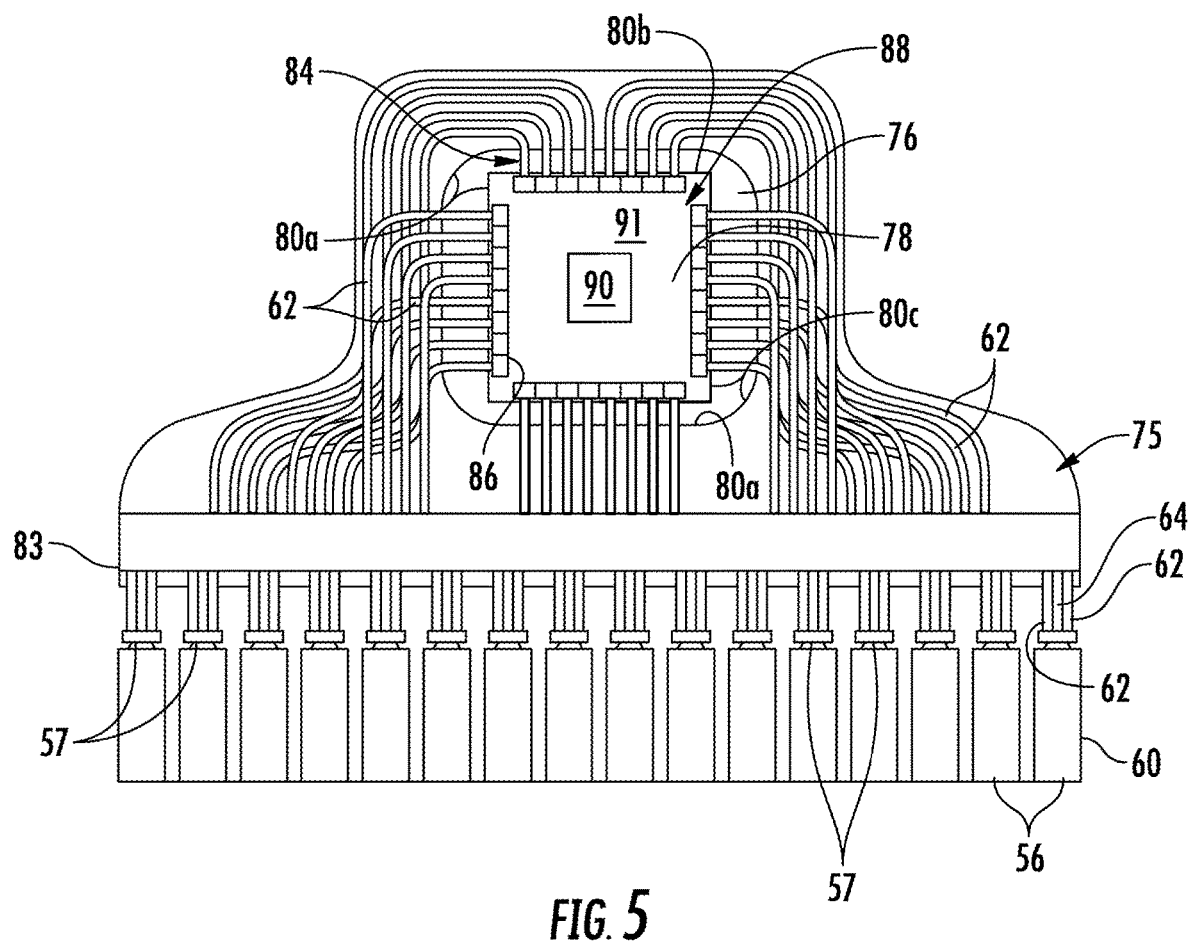
FIG. 5 is a top plan view of the routing assembly of FIG. 2 with a portion of the upper surface of the tray removed to illustrate the routing of the cables therein.
Figure 5A:
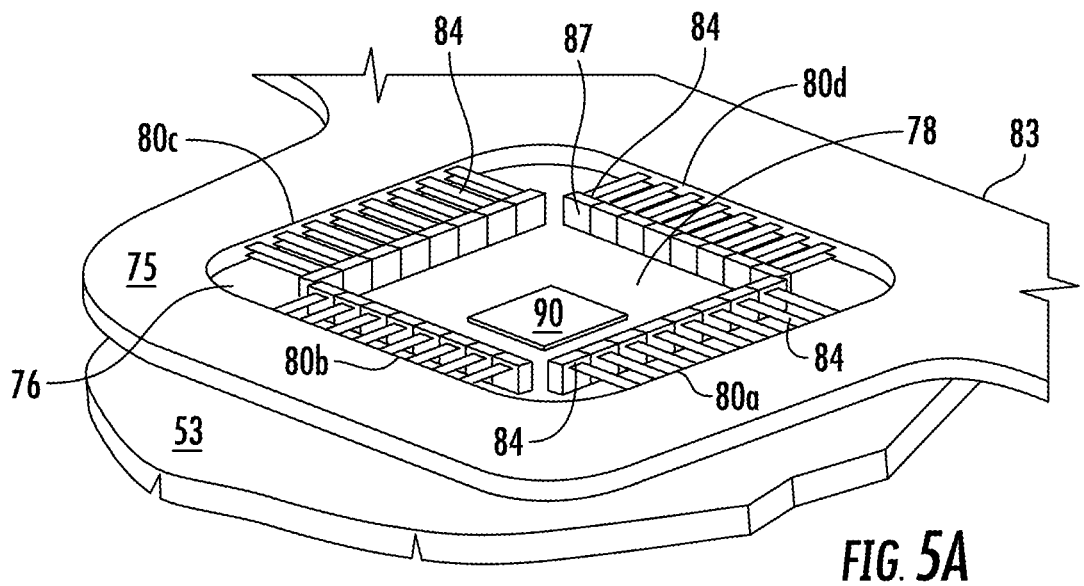
FIG. 5A is an enlarged perspective view of the chip package opening of FIG. 5.
Figure 5B:
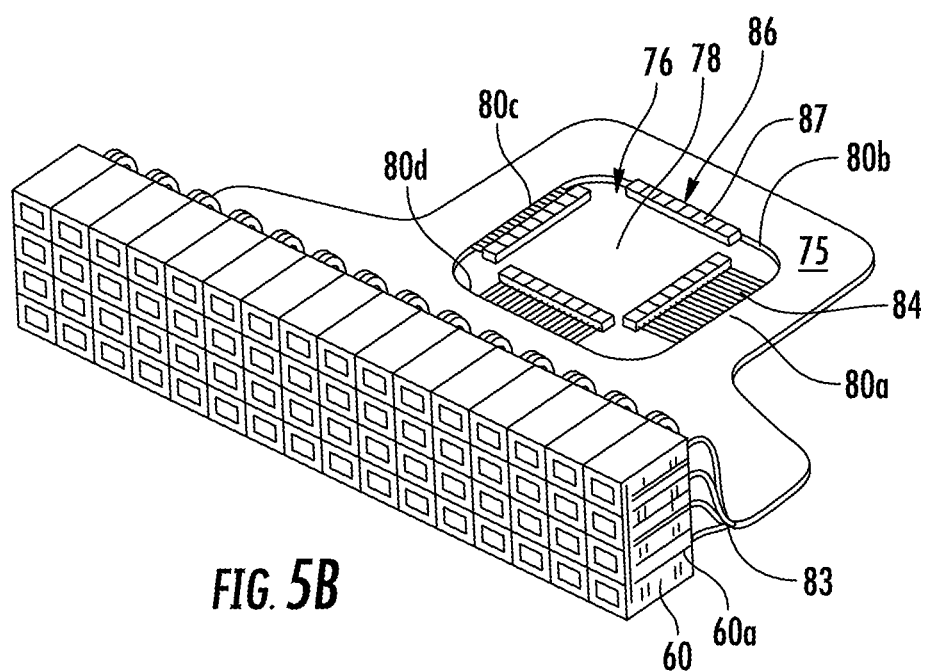
FIG. 5B is a perspective view of the routing assembly of FIG. 5 with the chip package removed but without the top portion of the tray removed.

The cables 62 are illustrated in FIG. 5 as having first ends 82 extending from the connectors 55, 57 toward the tray 75. The second ends 84 of the cables 62 extend into the tray opening 76 as illustrated where they are terminated to connectors 86 that will mate with the chip package 88. The connectors 86 can be configured to connect to a connector mounted on or adjacent a substrate 91 (such as connector 95 discussed below) or can be configured to press directly onto the substrate 91 (or a supporting motherboard adjacent the substrate). The second ends 84 of the cables 62 exit the tray 75 to enter the tray opening 76. In an embodiment, the chip package 88 is disposed on the motherboard 53, and the chip package 88 includes a plurality of contacts in the form of receptacle style connectors 95 which are preferably arranged around the perimeter thereof and aligned with the tray opening 76 so as to allow for mating with connectors 86 at the cable second ends 84. In another aspect, the chip package 88 may be included as part of the overall routing assembly 74. (FIGS. 2 and 2A.)

Figure 3:
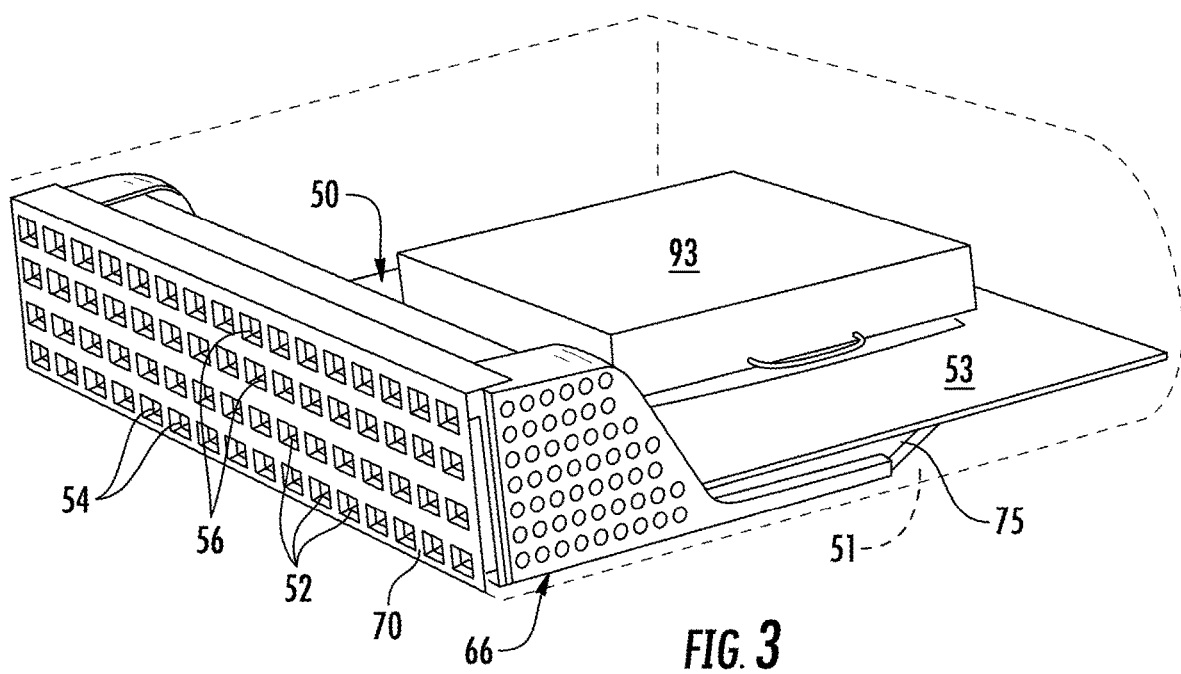
FIG. 3 is a perspective view of an embodiment of a routing assembly in place underneath a motherboard and in which the chip package has a heat sink in place thereon.
Figure 3A:
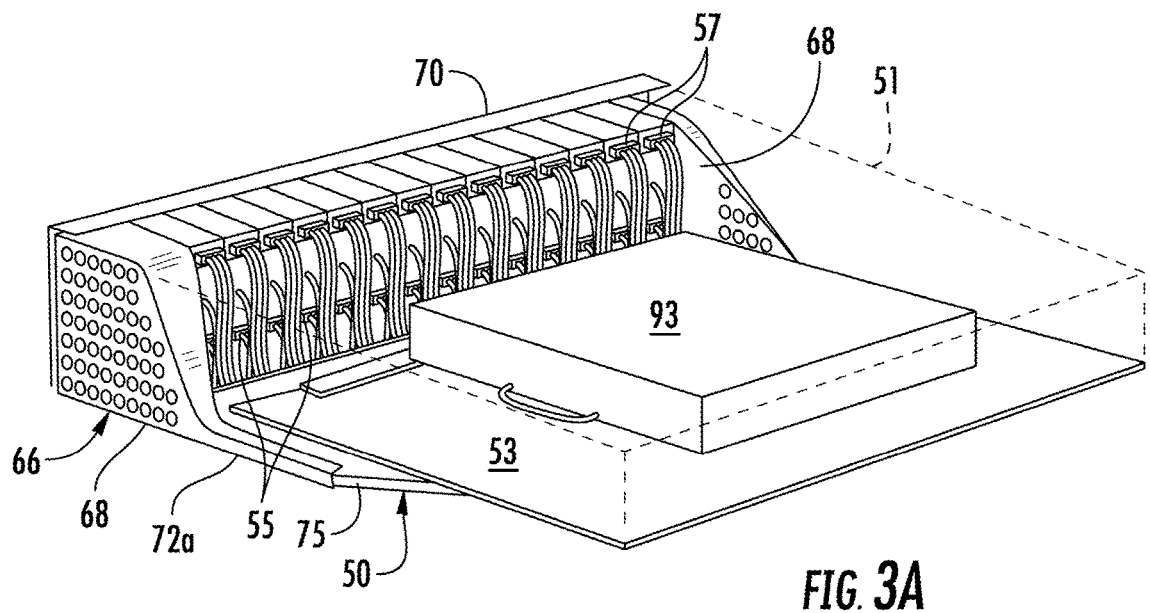
FIG. 3A is another perspective view of the embodiment depicted in FIG. 3.

It should be noted that the tray 75 can be positioned above the circuit board, such as is depicted in FIGS. 4A-6. Alternatively, as shown in FIGS. 7-10, the tray 75 can be positioned below the motherboard 53. In such a configuration, as illustrated in FIGS. 3 & 3A, the area above the motherboard 53 is free to accommodate thermal transfer members 93, which can include heat spreaders and/or heat sinks having perimeters larger than that of the processor 90 because the integration of the cables 62 into the tray 75 frees up most, if not all, of the space above the tray 75 for other uses.

The cables 62 (and low speed wires 64) may be positioned as part of the tray 75 in a variety of ways that suitably holds them in place from where they enter the routing assembly 74, such as along a leading edge 83 of the tray 75 to where they exit the tray 75 and enter the tray opening 76. The cables 62 can be accommodated in the tray 75 by enclosing the cables 62 in the tray 75. The body portions of the cables 62 are preferably completely surrounded by the tray 75 so that the two form an integral part that can be provided in the routing assembly 74. One routing pattern of the cables 62 is illustrated in FIG. 5, which has the upper portion of the tray 75 removed for clarity to show the paths in which the cables 62 are laid.

The cables 62 can be terminated at their second ends 84 to the aforementioned connectors 86 before the forming of the tray 75. Inasmuch as the first ends of the cables 62 are directly terminated to the terminals of the cable direct connectors 55, the second connectors 86 permit the cables 62 to be directly connected to the chip package 88, thereby completely bypassing the motherboard 53 as a routing support. In instances where the tray 75 is located above the motherboard 53, the connectors 86 are positioned around the chip package 88 and are preferably arranged along the edges of the tray opening 76. Or, as illustrated in FIGS. 7-10, the connectors 86 may be configured to mate with the chip package 88 from below, it being understood that such a configuration may be preferred in certain circumstances.

Figure 10:
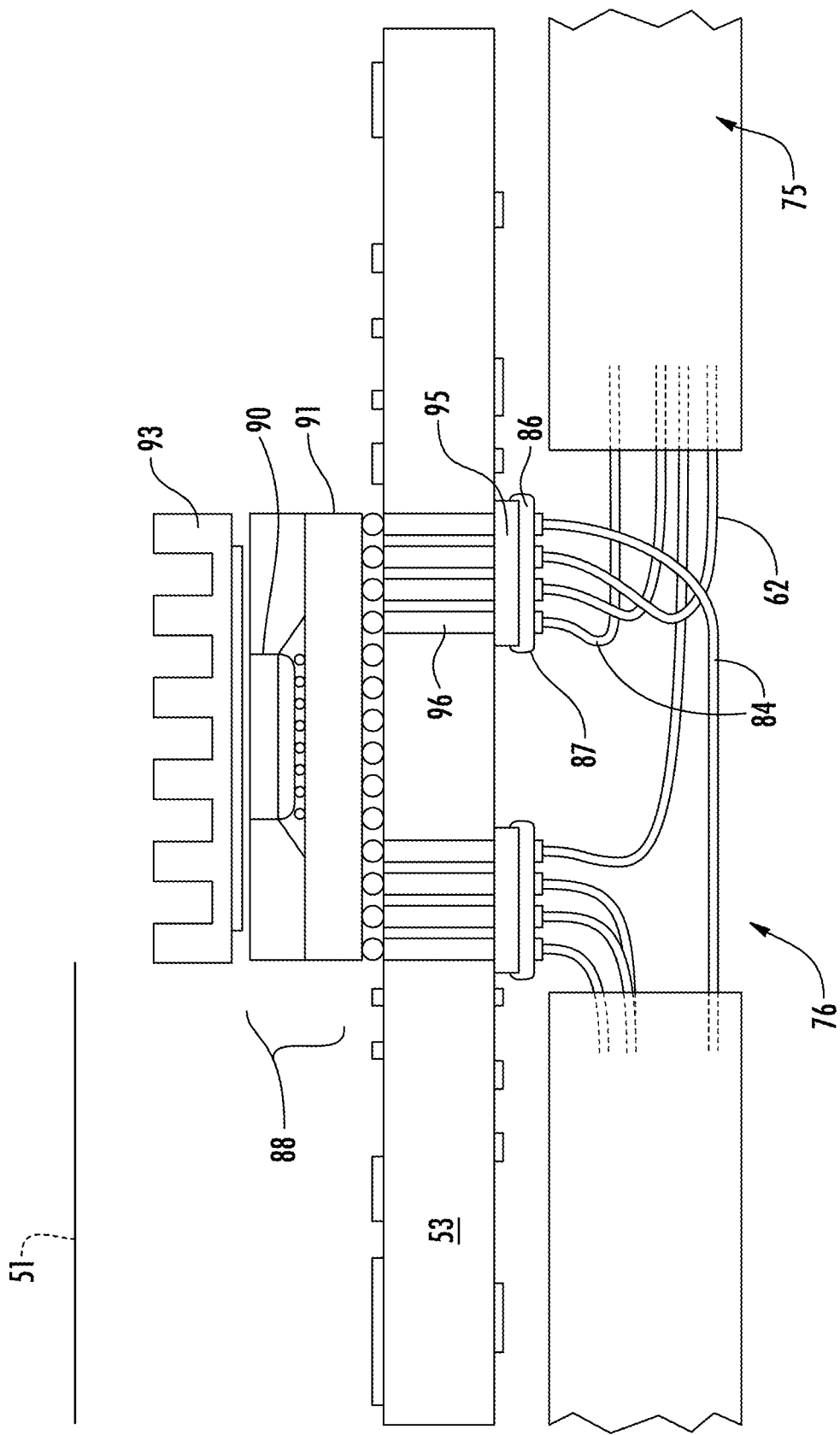
FIG. 10 is a sectional schematic illustration of an embodiment of a routing assembly connected to a chip package when a tray is positioned below a motherboard; and, FIG. 11 is a perspective view of an embodiment of system that has some connectors routing through a routing assembly and other connectors routing through a circuit board.

In such an instance, the routing assembly 74 may be inserted into the host device housing and the motherboard 53 is placed in the housing of the device 51 over the tray 75, where it may be spaced apart from and below the motherboard by standoffs 92 or the like. FIG. 6 illustrates the connectors 86 and their associated housings 87 facing toward the substrate 91 in the tray opening 76 so as to make contact with the substrate 91 so as to provide a connection to processor 90 (or alternatively with a motherboard 53 that supports the substrate 91, as shown in FIG. 10). Naturally, a similar configuration can be provided below for a tray 75 positioned below the motherboard 53. The connector housings 87 may take the form of chiclets which can house as few as a single pair of signal conductors. As can be appreciated, the connector housing 87 can easily mate with receptacle connectors 95 on the motherboard 53 or substrate 91. In addition, if the cables 62 are fixed in position in the tray so that the cables 62 only extend a short distance out of the tray 75 before terminating to connectors 86 then the structure also helps ensure the connectors 86 are properly aligned with the motherboard or chip package 88 (and any corresponding mating receptacle connectors) and the alignment can make assembly much easier. The connectors 86 and the mating receptacle connectors may be provided with a low profile so as to fit within the tray opening 76 and potentially will not project outside of the tray opening 76, thus minimizing the space requirements of the routing assembly 74. As can be appreciated, the cables extend into the opening from at least two directions and preferably will extend from multiple edges of the tray.

Such a structure is shown schematically in the sectional diagrams of FIGS. 8A & 10, where the board connectors 95 are shown in contact with conductive vias 96 the extend through the motherboard 53 to connect with the substrate 91. As can be appreciated, a BGA structure can attach the substrate 91 to the motherboard 53. It can be seen that the second ends 84 of the cables 62 and their corresponding connectors 86 can be accommodated within the volume of the tray opening 76 so as not to unduly increase the height of the device 51. As can be appreciated, the depicted connectors 86 have a mating direction that is transverse to the tray.

Figure 11:
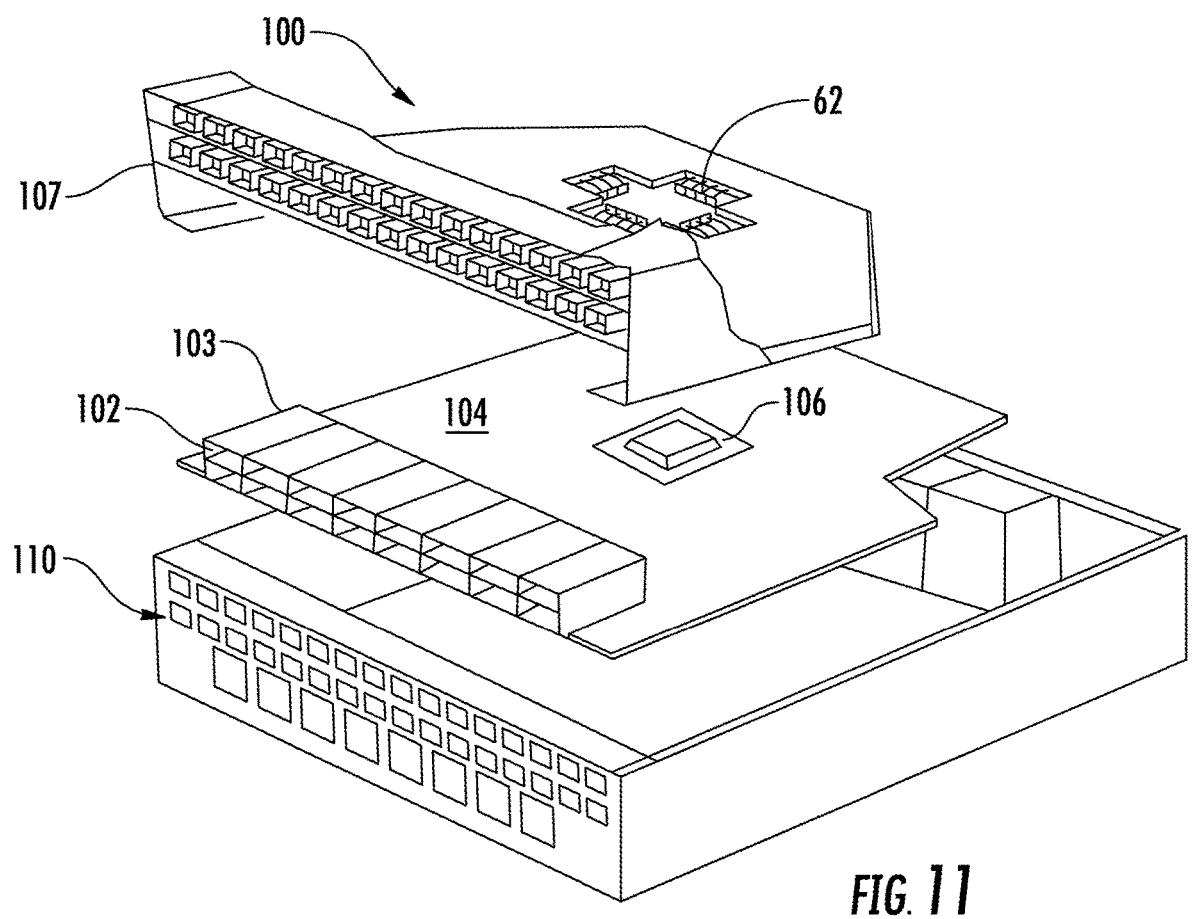

FIG. 11 illustrates another embodiment of a routing assembly 100 of the present disclosure in which connector ports 102 are in place on the motherboard 104 and connectors 107 are desired along a front 110. The connector ports 102 are arranged in two horizontal rows within their shielding cages 103 and in place upon the motherboard 104 that has a chip package 106 in place. The routing assembly 100 has two rows of connector ports 107 held in the frame at a height that permits the assembly to be placed over the existing connector ports 102 and utilize the high speed advantages of the cables 62 of the routing assembly 100 for that set of connector ports. This structure will permit a combination of connector ports connected to a circuit board and connector ports connected to a chip package via cables, thus providing flexibility in system architecture. While the depicted embodiment illustrate a system that includes two rows of connector ports mounted on the circuit board and two rows of connector ports provided by the routing assembly, alternative embodiments could have 1 row of each type or could vary the number of rows, depending on system needs.

The disclosure provided herein describes features in terms of preferred and exemplary embodiments thereof. Numerous other embodiments, modifications and variations within the scope and spirit of the appended claims will occur to persons of ordinary skill in the art from a review of this disclosure.

We claim:

1. A system, comprising:
   a box;
   a motherboard positioned in the box, the motherboard having a first side and a second side with a chip package on the first side;
   a routing assembly positioned in the box, the routing assembly including a front face that defines a N by M matrix of connector ports, where N and M are at least 2, the routing assembly including a tray extending from the front face;
   a plurality of first connectors positioned in the connector ports;
   a plurality of cables positioned in the tray, each of the cables having a first end terminated to one of the plurality of first connectors and a second end that extends from the tray; and
   a plurality of second connectors terminated to the second ends and positioned adjacent the chip package, the plurality of second connectors arranged in a pattern aligned with the chip package, wherein the plurality of second connectors are configured to be electrically connected to the chip package so as to provide a signal path between the first connectors and the chip package that substantially avoids traveling through the motherboard.

2. The system of claim 1, wherein the connection between one of the first connectors and the chip package defines a transmission channel that is configured to support a 20 Gbps data rate.

3. The system of claim 1, wherein the tray extends from the front face in a cantilevered manner.

4. The system of claim 1, wherein the second connectors are configured to be mounted on the second side of the motherboard.

5. The system of claim 4, wherein at least some of the second connectors are positioned directly opposite the chip package.

6. The system of claim 1, wherein the motherboard supports a plurality of third connectors, the third connectors arranged along a plurality of sides of the chip package, the second connectors configured to mate with the third connectors.

7. The system of claim 6, wherein the plurality of cables are in a preconfigured arrangement that positions the second connectors so that they can mate with the third connectors.

8. The system of claim 1, wherein one of N and M is at least 4.

9. The system of claim 1, wherein:
   the box comprises a front side; and
   the front face of the routing assembly is positioned at the front side of the box.

10. A system, comprising:
    a box;
    a circuit board positioned in the box, the circuit board having a first side and a second side and supporting a chip package on the first side;
    a routing assembly positioned in the box, the routing assembly including a front face that defines a N by M matrix of connector ports, where both N and M are at least 2 the routing assembly including a tray extending from the front face;
    a plurality of first connectors positioned in the connector ports;
    a plurality of cables positioned in the tray, each of the cables having a first end terminated to one of the plurality of first connectors and a second end that extends out of an edge of the tray; and
    a plurality of second connectors terminated to the second ends and positioned adjacent the chip package, the plurality of second connectors arranged in a pattern that extends along the second side of the circuit board, wherein the plurality of second connectors are electrically connected to the chip package by a plurality of vias that extend between the first side and the second side so that a signal path between the first connectors and the chip package travels through the plurality of vias but otherwise substantially avoids traveling through the circuit board.

11. The system of claim 10, wherein the tray extends from the front face in a cantilevered manner.

12. The system of claim 10, wherein one of N and M is at least 4.

13. The system of claim 10, wherein the tray has a top surface facing the circuit board and a bottom surface facing away from the circuit board and the second connectors do not extend below the bottom surface when in a mated position.

14. The system of claim 10, wherein the tray is formed of a conductive material.

15. The system of claim 10, wherein the connection between one of the first connectors and the chip package defines a transmission channel that is configured to support a 20 Gbps data rate.

16. The system of claim 10, wherein the edge is an internal edge of the tray.

17. The system of claim 10, wherein:
    the box comprises a front side; and
    the front face of the routing assembly is positioned at the front side of the box.

* * * * *